(12) United States Patent
Kim et al.

(10) Patent No.: US 7,420,324 B2
(45) Date of Patent: Sep. 2, 2008

(54) ORGANIC EL DISPLAY AND FABRICATING METHOD THEREOF

(75) Inventors: Seung Tae Kim, Incheon-si (KR); Hong Gyu Kim, Uiwang-si (KR)

(73) Assignee: LG Display Co., Ltd., Seoul (KR)

( * ) Notice: Subject to any disclaimer, the term of this patent is extended or adjusted under 35 U.S.C. 154(b) by 449 days.

(21) Appl. No.: 11/137,408

(22) Filed: May 26, 2005

(65) Prior Publication Data

US 2005/0269941 A1 Dec. 8, 2005

(30) Foreign Application Priority Data

| Jun. 3, 2004 | (KR) | ...................... 10-2004-0040466 |
| Jun. 3, 2004 | (KR) | ...................... 10-2004-0040467 |
| Jun. 4, 2004 | (KR) | ...................... 10-2004-0040826 |

(51) Int. Cl.
*H01J 1/62* (2006.01)

(52) U.S. Cl. ...................... 313/506; 313/498

(58) Field of Classification Search .................. 313/498, 313/506, 509, 512
See application file for complete search history.

(56) References Cited

FOREIGN PATENT DOCUMENTS

| JP | 2002-299054 | 10/2002 |
| JP | 2003-345271 A | 3/2003 |
| KR | 10-2004-0020808 A | 3/2004 |

*Primary Examiner*—Vip Patel
(74) *Attorney, Agent, or Firm*—Holland & Knight LLP

(57) ABSTRACT

A top and bottom emission organic EL display and fabricating method thereof are disclosed. The present invention includes a pixel area having a first area and a second area, a first organic EL device provided to the first area of the pixel area to emit light in one direction, a second organic EL device provided to the second area of the pixel area to emit light in a direction opposite to that of the first organic EL device, and a transistor electrically connected to the first and second organic EL devices to drive the first and second organic EL devices.

14 Claims, 23 Drawing Sheets

2nd EL device

1st EL device

54

ORGANIC EL DISPLAY AND FABRICATING METHOD THEREOF

This application claims the benefit of the Korean Patent Application Nos. 10-2004-0040466, filed on Jun. 3, 2004, 10-2004-0040467, filed on Jun. 3, 2004 and 10-2004-0040826 filed on Jun. 4, 2004, which is hereby incorporated by reference as if fully set forth herein.

BACKGROUND OF THE INVENTION

1. Field of the Invention

The present invention relates to an organic EL display and fabricating method thereof. Although the present invention is suitable for a wide scope of applications, it is particularly suitable for two-side emissions.

2. Discussion of the Related Art

Generally, a pixel area of an organic EL display consists of a switching thin film transistor for switching a pixel, a drive thin film transistor for driving the pixel, a storage capacitor, an anode (pixel electrode), an organic emitting layer, and a cathode (common electrode).

FIG. 1 is a diagram of circuit for an organic EL display according to a related art, FIG. 2 is a layout of an organic EL display according to a related art, and FIG. 3 is a cross-sectional diagram taken along a cutting line I-I in FIG. 2.

Referring to FIGS. 1 to 3, a semiconductor layer 2 is formed on a glass substrate 1 with polysilicon and the like. The semiconductor layer 2 is then patterned to leave an area for forming a thin film transistor therein.

A gate insulating layer 3 and a gate electrode conductive layer are sequentially formed over the substrate 1. The gate electrode conductive layer is then patterned to form a gate electrode 4.

Source and drain regions 2a and 2c of a thin film transistor are formed by implanting dopants in the semiconductor layer 2 with B, P or the like using the gate electrode 4 as an implantation mask and performing thermal treatment on the dopant-implanted semiconductor layer 2.

In this case, an undoped portion of the semiconductor layer 2 becomes a channel region 2b.

Subsequently, an insulating interlayer 5 is formed over the substrate 1. The insulating interlayer 5 and the gate insulating layer 3 are then selectively removed to expose the source and drain regions 2a and 2c of the thin film transistor.

An electrode line 6 is formed to be electrically connected to each of the exposed source and drain regions 2a and 2b.

A planarizing insulating layer 7 is formed over the substrate. The planarizing insulating layer 7 is then selectively removed to expose the electrode line 6 connected to the drain region 2c.

An anode (pixel electrode) 8 is formed to be electrically connected to the exposed electrode line 6.

Subsequently, an insulating layer 9 is formed between neighboring anodes 8.

And, a hole injection layer 10, a hole transport layer 11, an organic emitting layer, an electron transport layer 13 and an electron injection layer 14 are sequentially formed over the substrate.

After a cathode (common electrode) 15 of aluminum or the like has been formed over the substrate, a passivation layer 16 is formed on the cathode 15 to cut off oxygen or moisture.

However, in the above-fabricated related art organic EL display, the drive circuit occupies most parts of the pixel area to reduce a portion, through which the light can pass, i.e., to lower an aperture ratio.

Moreover, in case of employing a compensation circuit, the area occupied by the drive circuit in each pixel area is increased more to lower the aperture ratio considerably.

SUMMARY OF THE INVENTION

Accordingly, the present invention is directed to an organic EL display and fabricating method thereof that substantially obviate one or more problems due to limitations and disadvantages of the related art.

An object of the present invention is to provide an organic EL display and fabricating method thereof, in which light is emitted from a pixel area having a drive circuit formed thereon and by which a aperture ratio can be raised.

Another object of the present invention is to provide an organic EL display and fabricating method thereof, in which light can be emitted from top and bottom sides of one substrate to enable two-way viewings.

A further object of the present invention is to provide an organic EL display and fabricating method thereof, in which a pair of organic EL displays are simultaneously fabricated on one substrate, by which a corresponding process is simplified, and by which a process cost is lowered.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic EL display according to the present invention includes a pixel area having a first area and a second area, a first organic EL device provided to the first area of the pixel area to emit light in one direction, a second organic EL device provided to the second area of the pixel area to emit light in a direction opposite to that of the first organic EL device, and a transistor electrically connected to the first and second organic EL devices to drive the first and second organic EL devices.

Preferably, the first area is a first substrate surface having the transistor not formed thereon and the second area is the first substrate surface having the transistor formed thereon.

In another aspect of the present invention, an organic EL display includes a transparent substrate having a plurality of pixel areas wherein each of a plurality of the pixel areas is dived into a first area and a second area, a transistor formed on the second area of the transparent substrate, a second anode formed on the second area of the transparent substrate to be electrically connected to the transistor, a first anode formed on the first area of the transparent substrate to be electrically connected to the transistor, an organic EL layer formed on the first and second anodes, a first cathode formed on the organic EL layer on the first and second areas of the transparent substrate, and a second cathode formed on the first cathode of the first area of the transparent substrate.

Preferably, the first anode is a transparent electrode and the second cathode is a metal electrode having high reflectivity.

Preferably, the second anode comprises a metal electrode having high reflectivity and the first cathode comprises a thin metal electrode having transmittance.

In another aspect of the present invention, an organic EL display includes a transparent substrate having a plurality of pixel areas wherein each of a plurality of the pixel areas is dived into a first area and a second area, a transistor formed on the second area of the transparent substrate, a second anode formed on the second area of the transparent substrate to be electrically connected to the transistor, a first anode formed on the first area of the transparent substrate to be electrically connected to the transistor, an organic EL layer formed on the first and second anodes, a first cathode formed on the organic EL layer on the second area of the transparent substrate, and a second cathode formed on the organic EL layer on the first area of the transparent substrate.

In another aspect of the present invention, an organic EL display includes a first transparent substrate, a second transparent substrate, a transistor formed on a first area of the first transparent substrate, an pixel electrode formed on a second area of the first transparent substrate to be electrically connected to the transistor, a first cathode formed on the pixel electrode, a first organic EL layer formed on the first cathode, a second anode formed on the first organic EL layer, a second organic EL layer formed on the second anode, and a second cathode formed on the second organic EL layer to be electrically connected to either the transistor or the pixel electrode.

Preferably, a barrier is provided to a predetermined area of the second anode.

More preferably, the second cathode formed on the barrier is electrically connected to either the transistor or the pixel electrode.

In another aspect of the present invention, a method of fabricating an organic EL display includes the steps of preparing a transparent substrate having a plurality of pixel areas wherein each of a plurality of the pixel areas is dived into a first area and a second area, forming a transistor on the transparent substrate to lie on the second area of the pixel area, forming a first anode on the first area of the transparent substrate to be electrically connected to the transistor, forming a first insulating layer over the transparent substrate including the first anode, exposing a part of a drain area of the transistor by removing a predetermined area of the first insulating layer, forming a second anode on the first insulating layer in the second area of the transparent substrate to be electrically connected to the part of the drain area of the transistor, exposing the first anode by removing a portion of the first insulating layer, forming an organic EL layer over the substrate including the first and second anodes, forming a first cathode on the organic EL layer, and forming a second cathode on the first cathode in the first area of the pixel area.

In another aspect of the present invention, a method of fabricating an organic EL display includes the steps of preparing a transparent substrate having a plurality of pixel areas wherein each of a plurality of the pixel areas is dived into a first area and a second area, forming a transistor on the transparent substrate to lie on the second area of the pixel area, forming a first anode to be electrically connected to the transistor, forming a first insulating layer over the transparent substrate including the first anode, exposing a part of a drain area of the transistor by removing a predetermined area of the first insulating layer, forming a second anode on the first insulating layer in the second area of the pixel electrode to be electrically connected to the exposed transistor, exposing the first anode by removing a portion of the first insulating layer, forming an organic EL layer over the substrate including the first and second anodes, forming a first cathode on the organic EL layer to lie in the second area of the pixel area, and forming a second cathode on the organic EL layer to lie in the first area of the pixel area.

In another aspect of the present invention, a method of fabricating an organic EL display includes a first step of fabricating a first organic EL device, the first step including the steps of preparing a first transparent substrate, forming a transistor on a first area of the first transparent substrate, forming an pixel electrode on a first area of the first transparent substrate to be electrically connected to the transistor, forming an insulating layer over the first transparent substrate including the pixel electrode, exposing the transistor and the pixel electrode by removing the insulating layer selectively, and forming a first cathode, an organic EL layer and a first anode on the exposed pixel electrode sequentially, a second step of fabricating a second EL device, the second step including the steps of preparing a second transparent substrate, forming a second anode on the second transparent substrate, forming a barrier on a predetermined area of the second anode, and forming an organic EL layer and a second cathode on the second anode including the barrier sequentially, and a third step of bonding the first and second organic EL devices to each other so that the second cathode of the second organic EL device is electrically connected to the transistor of the first organic EL device.

In a further aspect of the present invention, a method of fabricating an organic EL display includes a first step of fabricating a first organic EL device, the first step including the steps of preparing a first transparent substrate, forming a transistor on a first area of the first transparent substrate, forming a first insulating layer over the first transparent substrate including the transistor, exposing the transistor by removing the first insulating layer selectively, forming an pixel electrode on the first area and a second area of the first transparent substrate to be electrically connected to the exposed transistor, and forming a first cathode, an organic EL layer and a first anode on the exposed pixel electrode of the first area of the first transparent substrate sequentially, a second step of fabricating a second EL device, the second step including the steps of preparing a second transparent substrate, forming a second anode on the second transparent substrate, forming a barrier on a predetermined area of the second anode, and forming an organic EL layer and a second cathode on the second anode including the barrier sequentially, and a third step of bonding the first and second organic EL devices to each other so that the second cathode of the second organic EL device is electrically connected to the exposed pixel electrode of the first organic EL device.

Preferably, after the pixel electrode forming step in the first step of fabricating the first organic EL device, a second insulating layer is formed on an area electrically connecting the pixel electrode and the transistor together and on an edge area of the pixel electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

The concept of the present invention lies in that a bottom emission type organic EL device is implemented on a pixel area having a drive circuit not formed thereon and a top emission type organic EL device is implemented on a pixel area having a drive circuit formed thereon, simultaneously, or in that a top emission type organic EL device is bonded onto a bottom emission type organic EL device to fabricate a top and bottom emission type display that can be independently driven.

Figure 1:
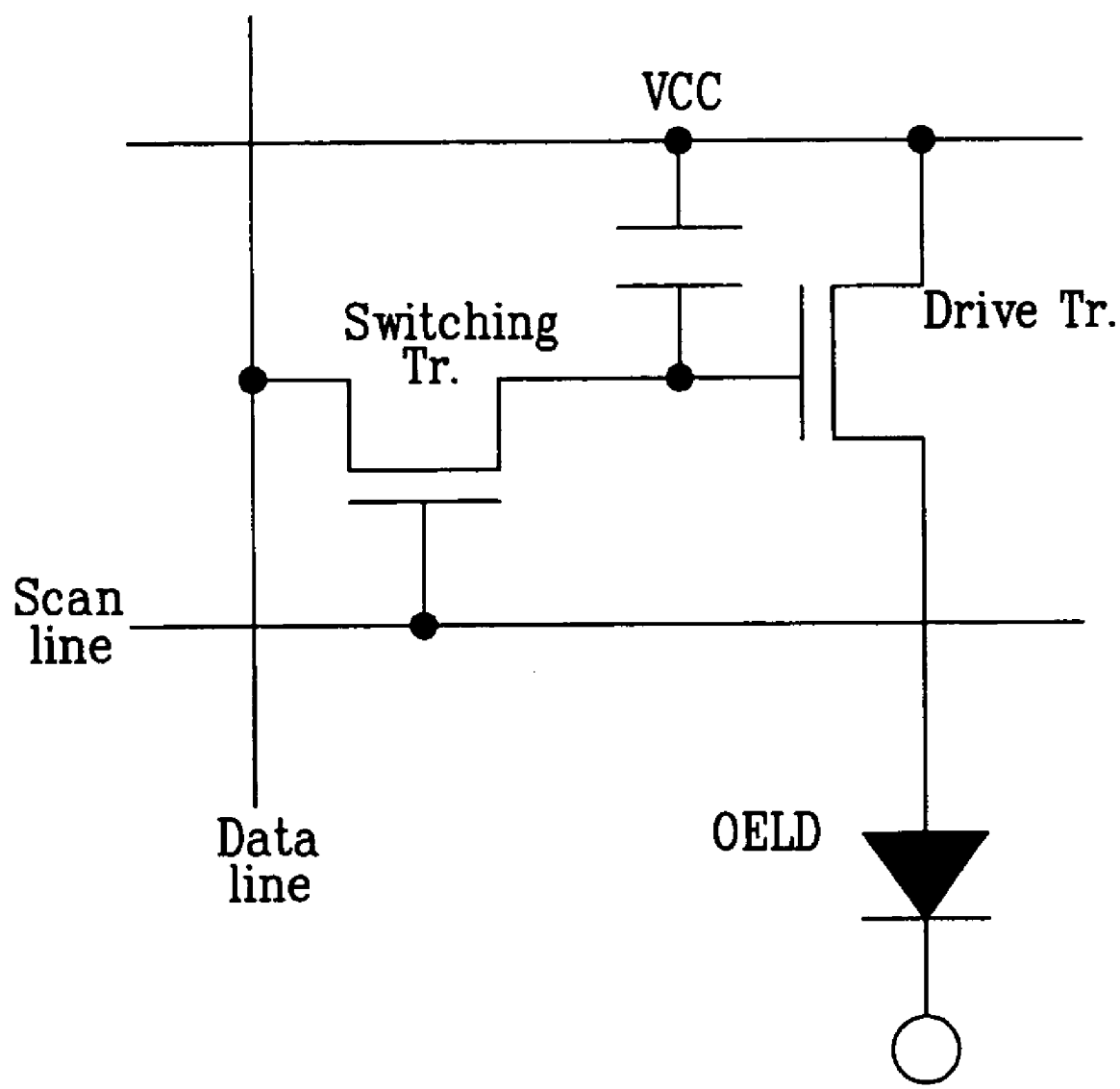
FIG. 1 is a diagram of circuit for an organic EL display according to a related art.
Figure 2:
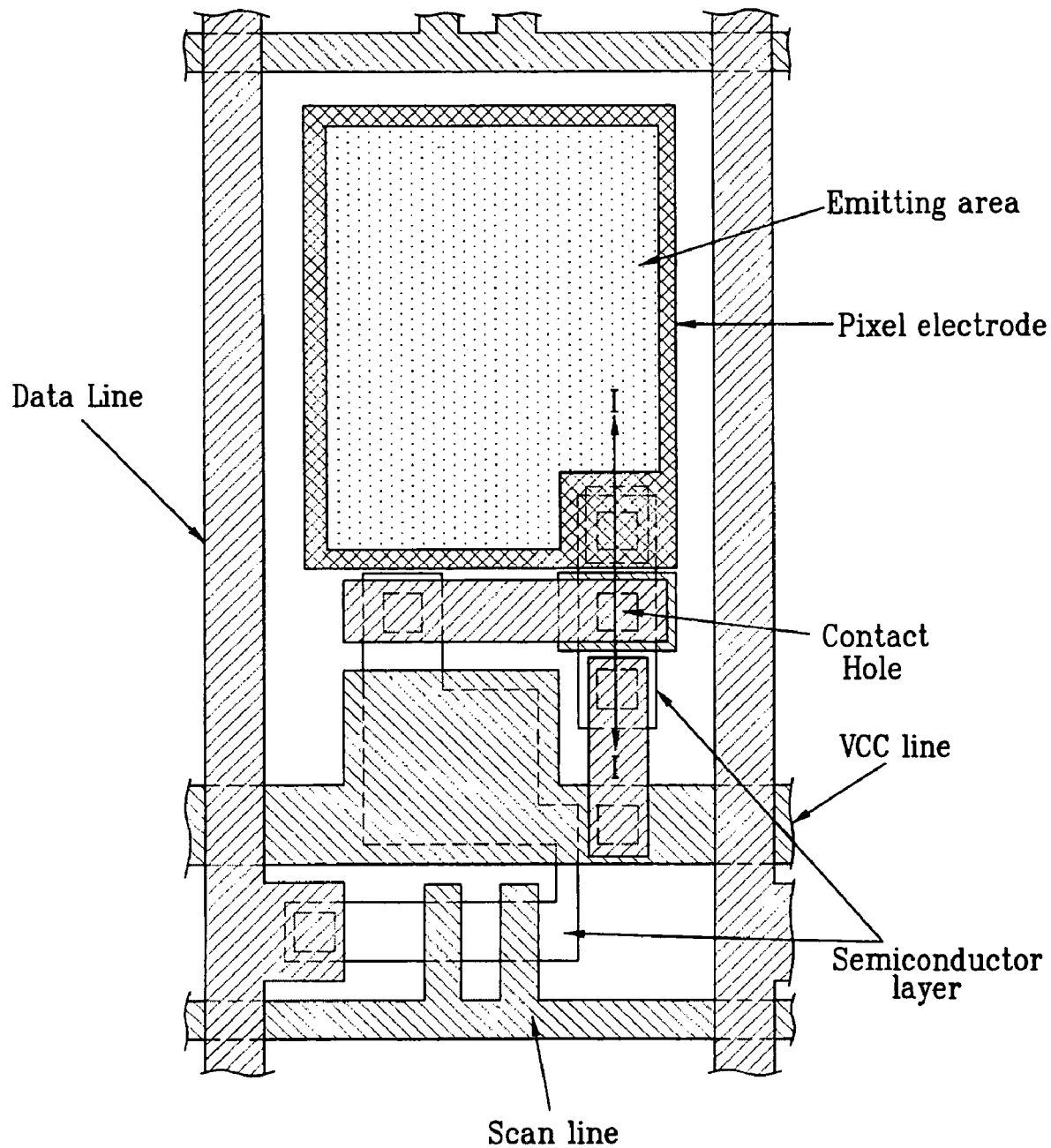
FIG. 2 is a layout of an organic EL display according to a related art.
Figure 3:
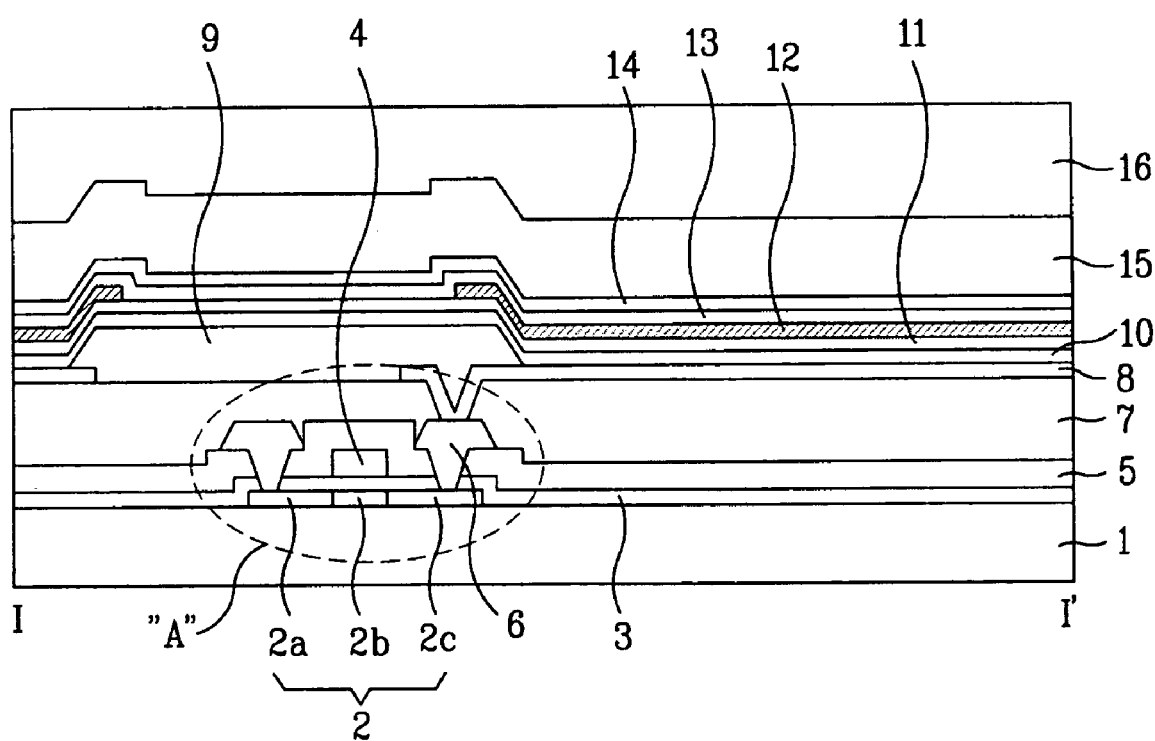
FIG. 3 is a cross-sectional diagram taken along a cutting line I-I in FIG. 2.
Figure 4:
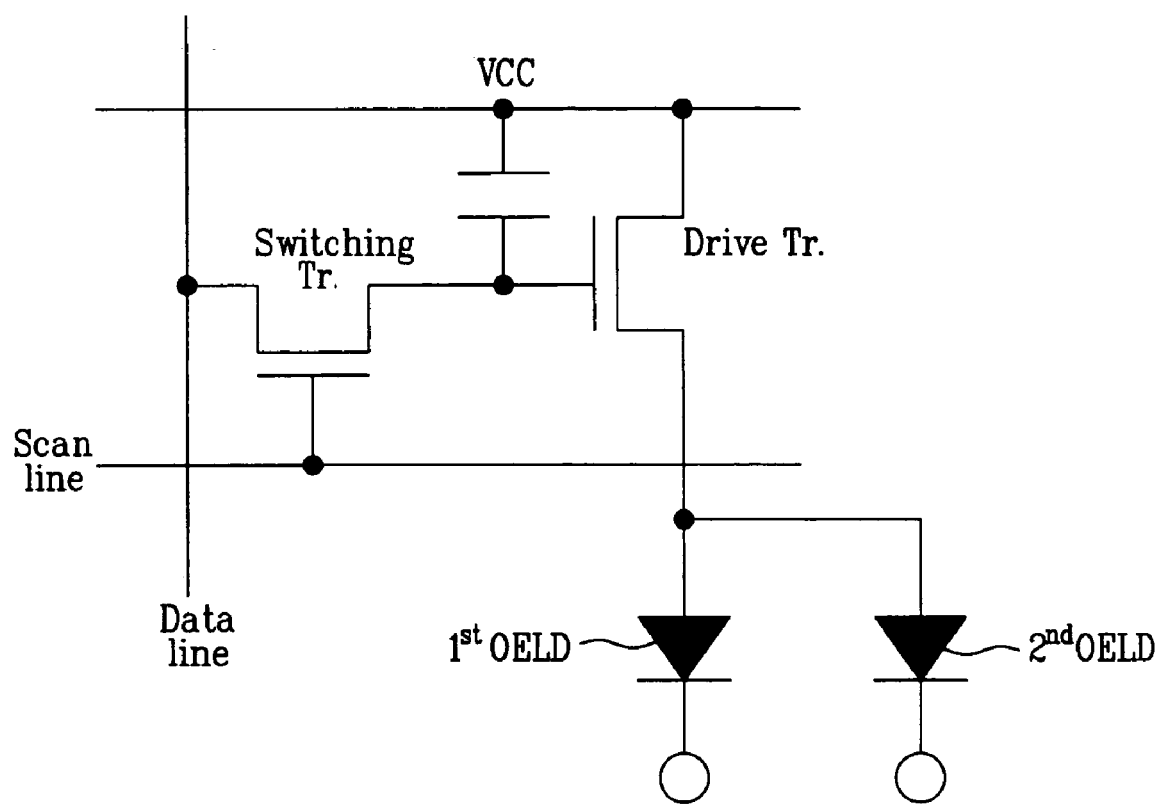
FIG. 4 is a diagram of circuit for an organic EL display according to the present invention.

FIG. 4 is a diagram of circuit for an organic EL display according to the present invention, and can be designed various types, occasionally.

Referring to FIG. 4, an organic EL display according to the present invention includes one drive circuit (e.g. transistor) and two organic EL devices.

In this case, the first organic EL device is provided to a first area of a pixel area to emit light in one direction.

And, the second organic EL device is provided to a second area of the pixel area to emit light in a direction opposite to that of the first organic EL device.

The drive transistor of thin film transistors formed on the drive area is electrically connected to the first and second organic EL devices to drive.

In this case, the first area of the pixel area can be a first substrate surface having no transistor formed thereon and the second area of the pixel area can be the first substrate surface having the transistor formed thereon.

Figure 5:
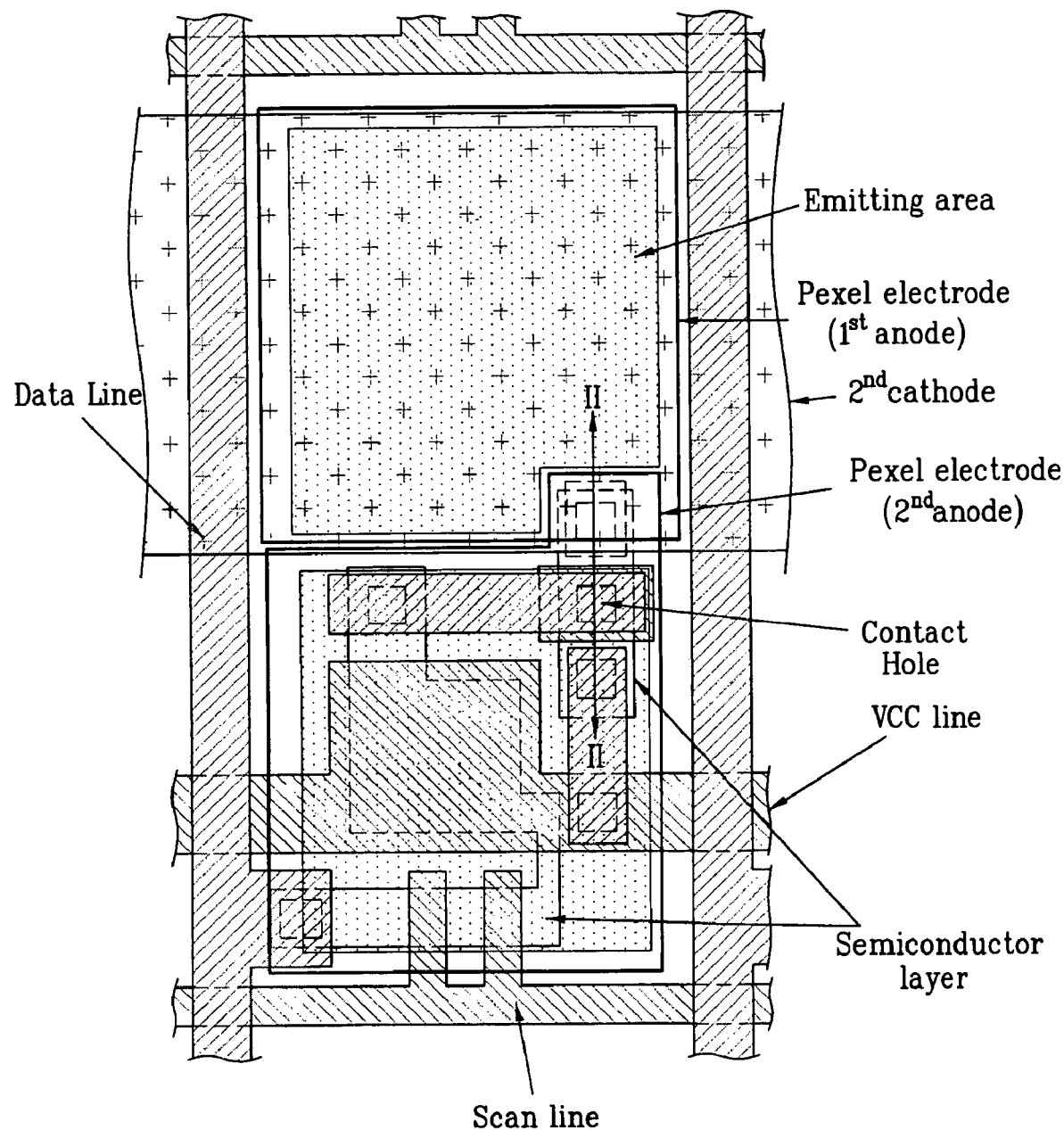
FIG. 5 is a layout of an organic EL display according to a first embodiment of the present invention.

FIG. 5 is a layout of an organic EL display according to a first embodiment of the present invention, and FIGS. 6A to 6J are cross-sectional diagrams taken along a cutting line II-II in FIG. 5.

Referring to FIG. 4, a pixel area of a first embodiment of the present invention includes a switching thin film transistor for switching a pixel, a driving thin film transistor for driving the pixel, a storage capacitor, a first anode (pixel electrode), a second anode (pixel electrode), an organic emitting layer, a first cathode (common electrode) and a second cathode (common electrode).

A transparent substrate of the present invention includes a plurality of pixel areas. Each of a plurality of the pixel areas is divided into a first area and a second area.

In this case, the first area is an emitting area and the second area is a drive circuit area.

The first embodiment of the present invention intends to fabricate the second area, i.e., the drive circuit area into another emitting area.

Hence, a first organic EL device is formed in the first area of the pixel area to emit light to a bottom of the transparent substrate and a second organic EL device is formed in the second area of the pixel area to emit light to a top of the transparent substrate.

In this case, a transistor for driving the first and second organic EL devices is formed in the second area.

And, the first organic EL device and the second organic EL device can be electrically connected to the same transistor to be driven. Alternatively, the first and second organic EL devices can be electrically connected to different transistors, respectively.

In the first embodiment of the present invention, the second anode is formed on the second area of the transparent substrate to be electrically connected to the transistor and the first anode is formed on the first area of the transparent substrate to be electrically connected to the transistor.

The organic EL layer is formed on the first and second anodes. The first cathode is formed on the organic EL layer on the first and second areas of the transparent substrate. And, the second cathode is formed on the first cathode on the first area of the transparent substrate.

In this case, the first anode is a transparent electrode formed of ITO or the like to have a high work function. The second cathode is formed of a conductive metal electrode having high reflectivity and low work function such as an AL electrode and the like.

And, the second anode is a metal electrode having high reflectivity like Al, Cr, Ag and the like. The first cathode is formed of a thin metal electrode having transmittance.

In this case, the first cathode can be formed by depositing Al 1~10 nm thick and depositing Ag 1~15 nm thick on the Al, by depositing alloy of Mg:Ag or the like 1~15 nm thick or by using a conductive material having low conductivity.

A fabricating process of the above-configured organic EL display according to the first embodiment of the present invention is explained as follows.

FIGS. 6A to 6J are process cross-sectional diagrams taken along a cutting line II-II in FIG. 5.

Figure 6A:
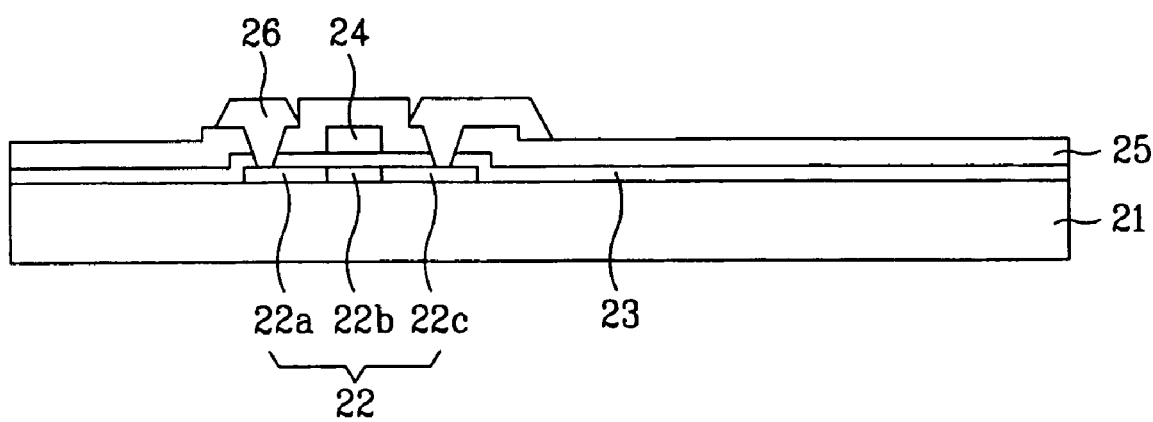
FIGS. 6A to 6J are cross-sectional diagrams taken along a cutting line II-II in FIG. 5.

Referring to FIG. 6A, a transparent substrate 21 having a plurality of pixel areas each of which is divided into a first area (emitting area) and a second area (drive circuit area).

A semiconductor layer 22 is formed on the second area of the transparent substrate 21 using polysilicon and the like and is then patterned to be utilized as an active layer of a thin film transistor.

After a gate insulating layer 23 has been formed on the transparent substrate 21 including the semiconductor layer 22, a gate electrode 24 is formed on the gate insulating layer 23.

Subsequently, impurities or dopants are implanted into the semiconductor layer 22 using the gate electrode 24 as an implantation mask and are then annealed to form a source region 22a and a drain region 22c of the thin film transistor.

An insulating interlayer 25 is formed on an entire surface of the transparent substrate 21 including the gate electrode 24 and is then patterned to expose portions of the source and drain regions 22a and 22c, respectively.

Thereafter, electrodes 26 are formed to be electrically connected to the source and drain regions 22a and 22c, respectively to complete the thin film transistor.

Figure 6B:
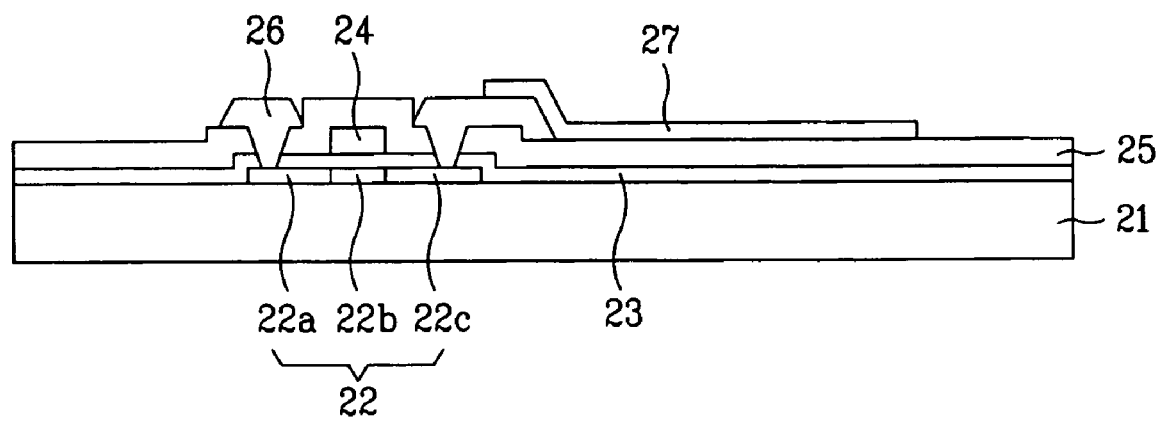

Referring to FIG. 6B, a transparent conductive substance having a high work function value such as ITO, IZO and the like is formed on the insulating interlayer 25 and is then patterned to form a first anode 27 for bottom emission.

In this case, the first anode 27 is formed in the first area of the pixel area to be electrically connected to the electrode 26 of the thin film transistor.

Figure 6C:
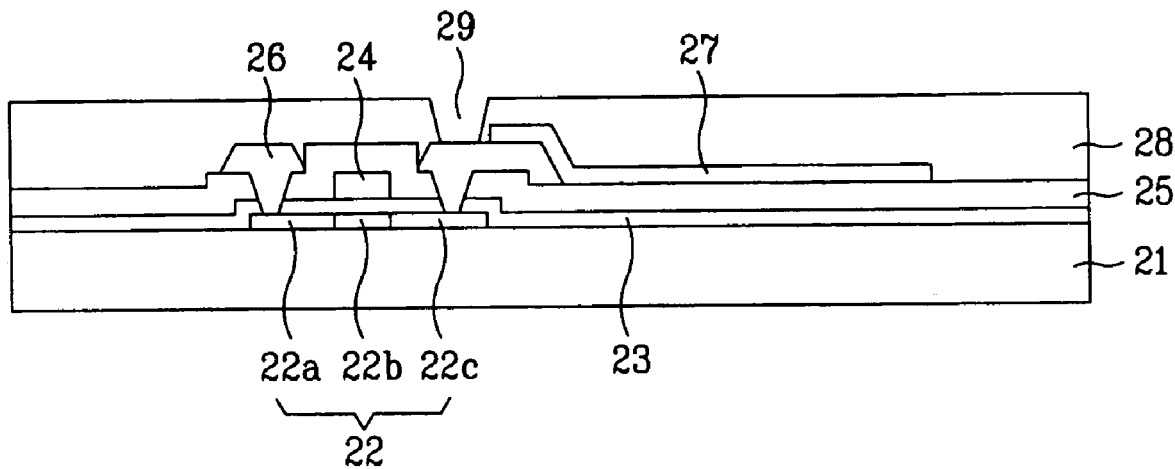

Referring to FIG. 6C, a planarizing layer 28 is formed over the substrate to planarize a surface over the substrate using an insulator. The planarizing layer 28 is patterned to form a contact hole 29 exposing a portion of the electrode 26 of the drain region 22c.

Figure 6D:
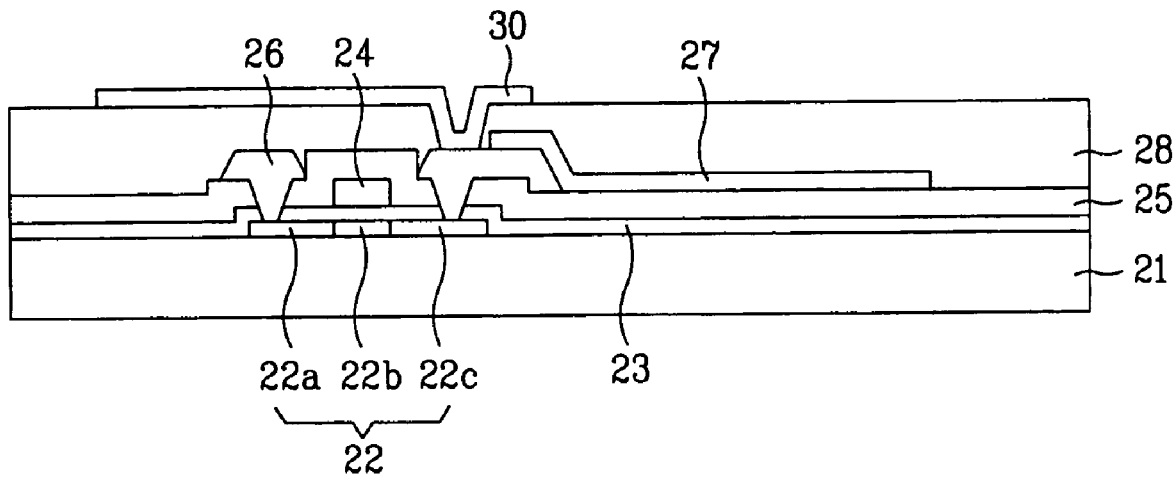

Referring to FIG. 6D, a conductive substance having high reflectivity such a Cr, Al, Mo, Ag, Au and the like on the planarizing layer 28 in the second area of the pixel area and is then patterned to form a second anode 30 for top emission.

Figure 6E:
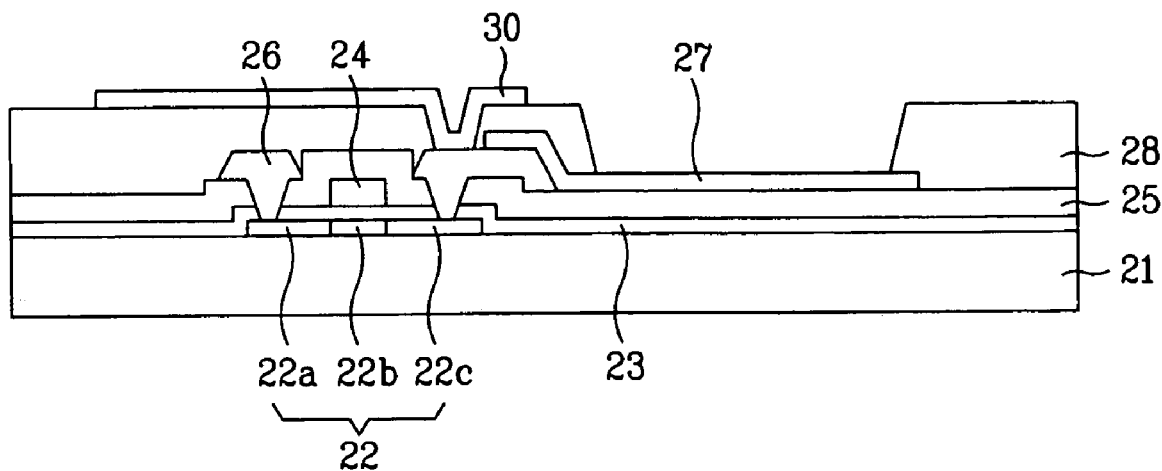

Referring to FIG. 6E, a portion of the planarizing layer 28 is removed to expose the first anode 27.

Figure 6F:
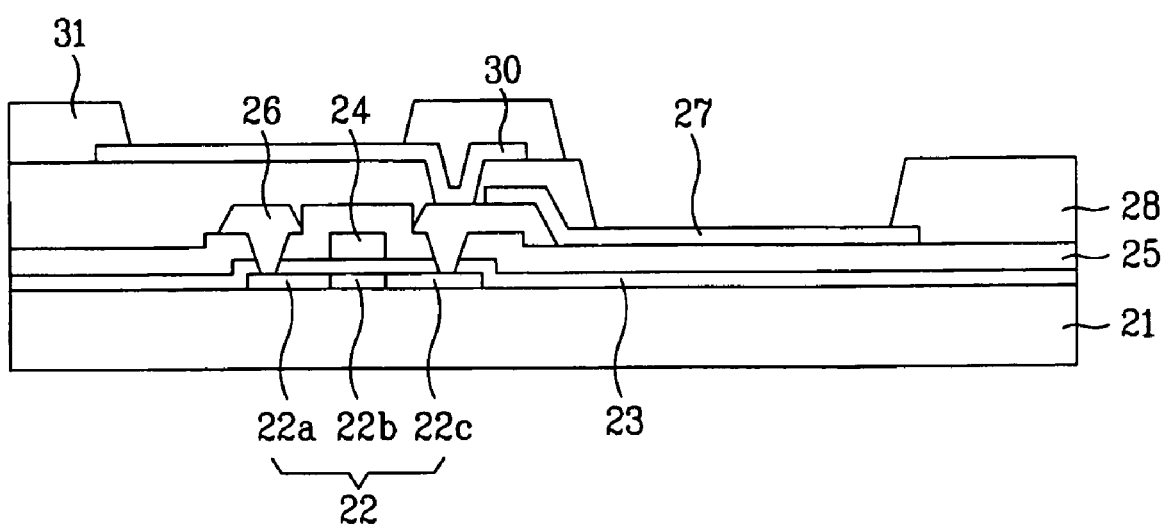

Referring to FIG. 6F, an insulating layer 31 is formed over the substrate and is then patterned to remain on an electrically connecting area between the second anode 30 and the electrode 26 and an edge area of the second anode 30 only.

Figure 6G:
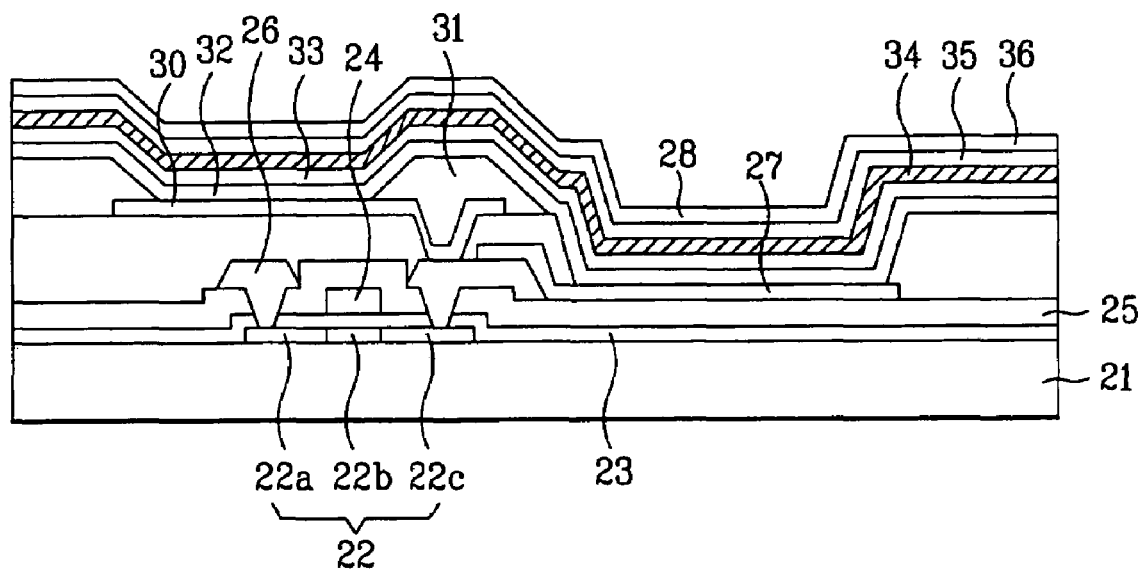

Referring to FIG. 6G, a hole injection layer 32, a hole transport layer 33, an organic emitting layer 34, an electron transport layer 35 and an electron injection layer 36 are sequentially formed on the first and second anodes 27 and 30 to form an organic EL layer.

Figure 6H:
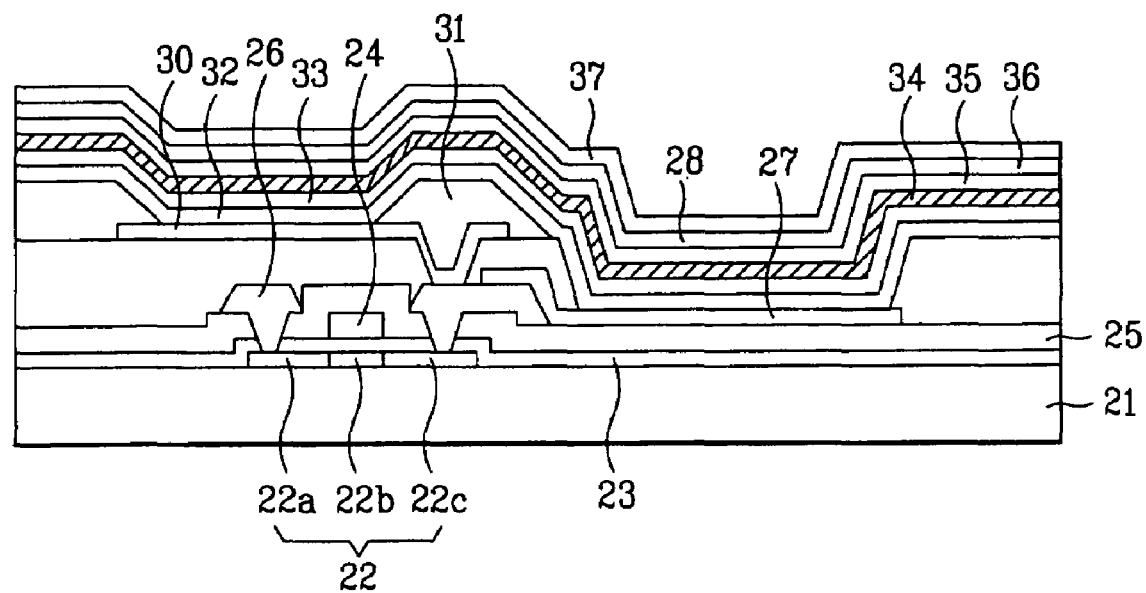

Referring to FIG. 6H, a first cathode 37 is formed on the electron injection layer 36 of the organic EL layer.

In this case, the first cathode 37 is a thin metal electrode having transmitivity and can be formed by depositing Al 1~10 nm thick and depositing Ag 1~15 nm thick on the Al, by depositing alloy of Mg:Ag or the like 1~15 nm thick or by using a conductive material having low conductivity.

Figure 6I:
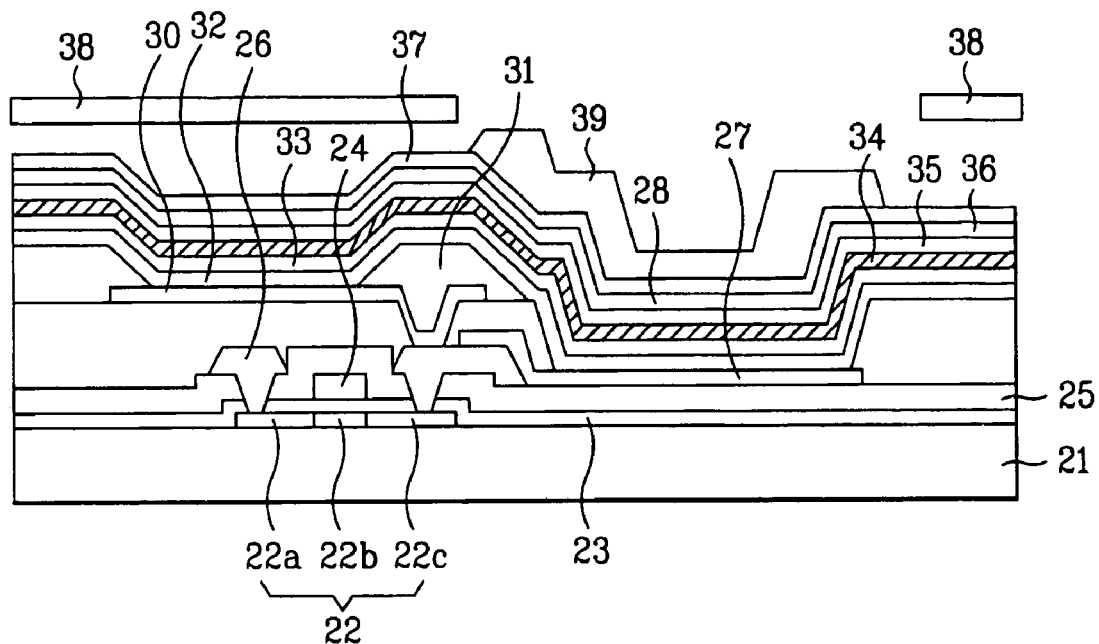

Referring to FIG. 6I, a second cathode 39 for bottom emission is formed on the first cathode 37 on the first area of the pixel area using a first shadow mask 38.

In this case, the second cathode 39 is formed of a conductive material having high reflectivity and low work function such as Al.

Figure 6J:
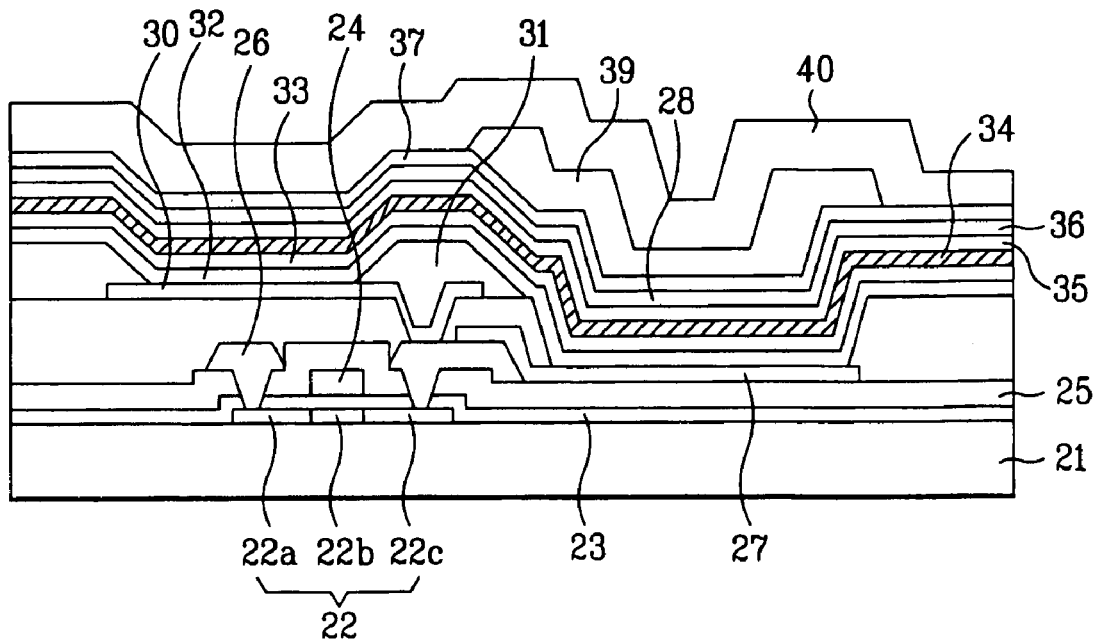

Referring to FIG. 6J, a passivation layer 40 is formed over the substrate to cut off penetration of oxygen or moisture into the organic EL layer. And, a protective cap (not shown in the drawing) is put thereon.

Figure 7:
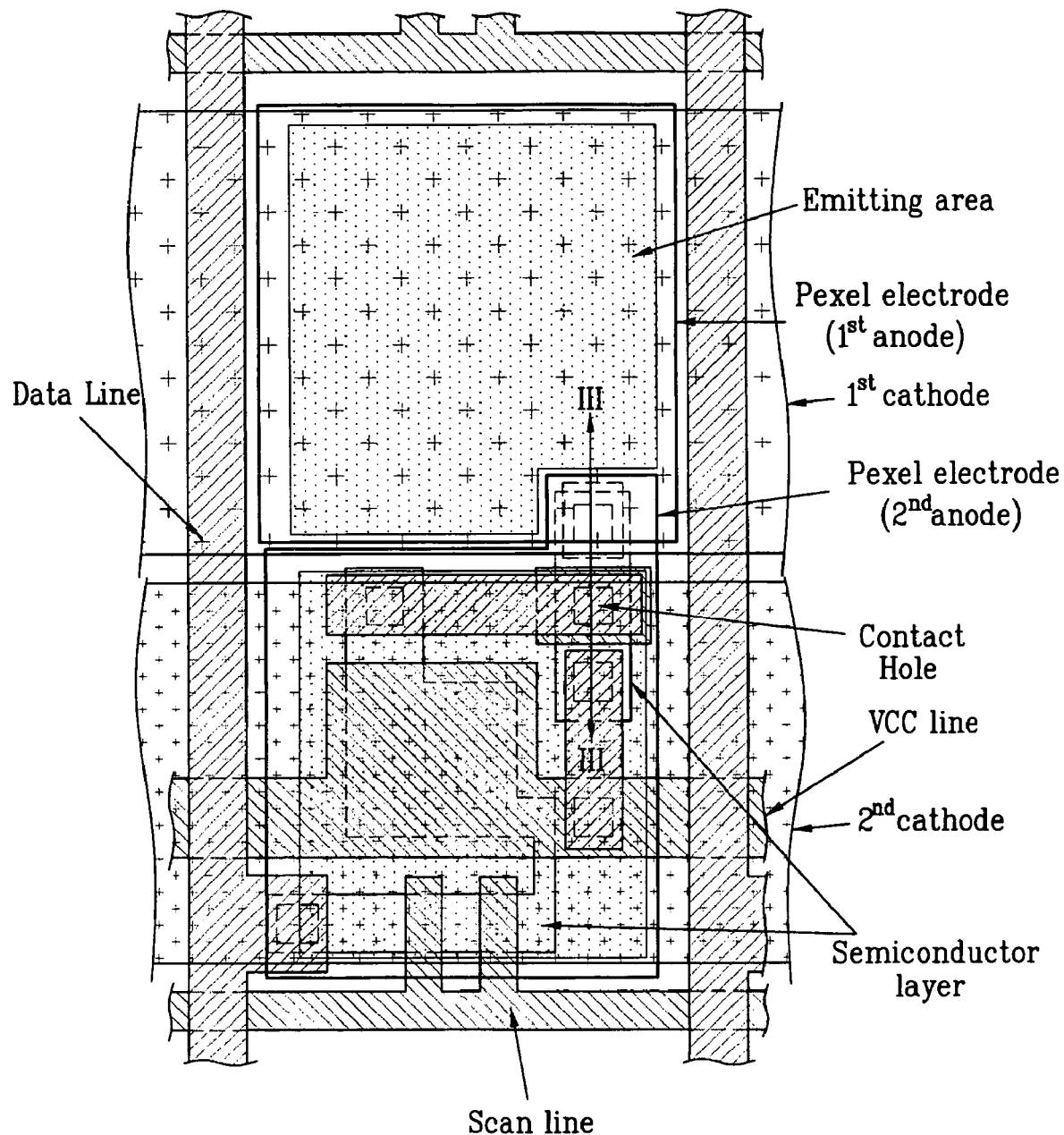
FIG. 7 is a layout of an organic EL display according to a second embodiment of the present invention.

FIG. 7 is a layout of an organic EL display according to a second embodiment of the present invention, and FIGS. 8A to 8J are cross-sectional diagrams taken along a cutting line III-III in FIG. 7.

Referring to FIG. 7, a second embodiment of the present invention differs from the first embodiment of the present invention only in a location of a first cathode.

The first cathode of the second embodiment of the present invention is formed in the second area of the pixel area only.

As the configuration of the second embodiment of the present invention is similar to that of the first embodiment of the present invention, its detailed explanation is skipped.

A method of fabricating the above-configured organic EL display according to the second embodiment of the present invention is explained as follows.

FIGS. 8A to 8G in the second embodiment of the present invention are equivalent to FIGS. 6A to 6G in the first embodiment of the present invention, of which explanation is skipped.

Figure 8A:
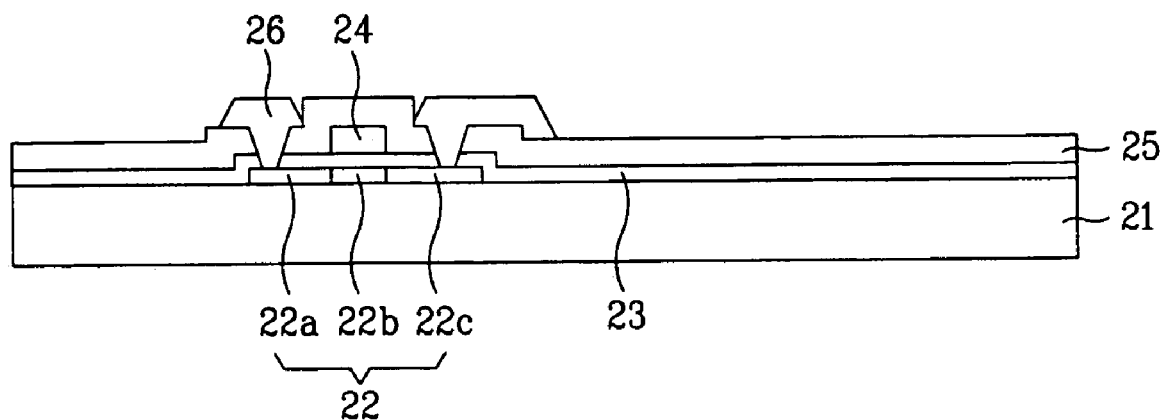
FIGS. 8A to 8J are cross-sectional diagrams taken along a cutting line III-III in FIG. 7.
Figure 8B:
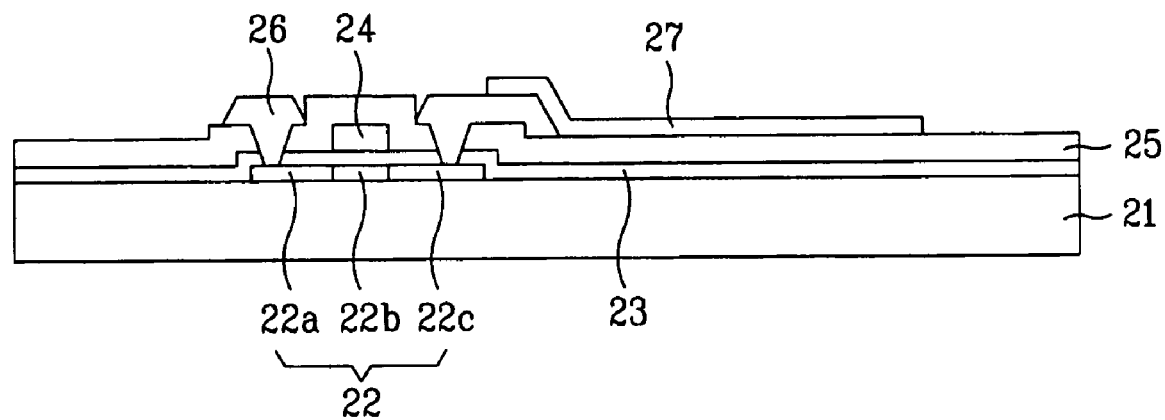
Figure 8C:
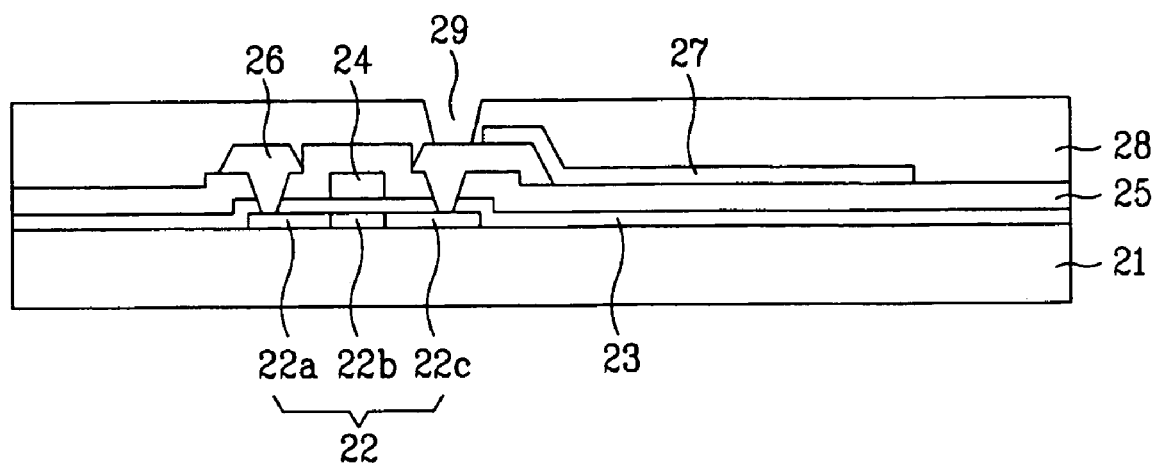
Figure 8D:
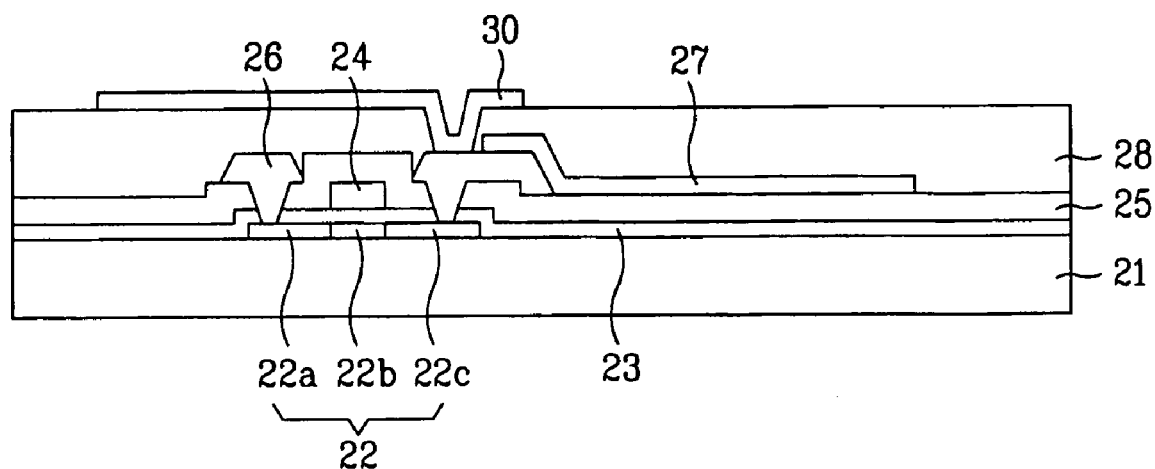
Figure 8E:
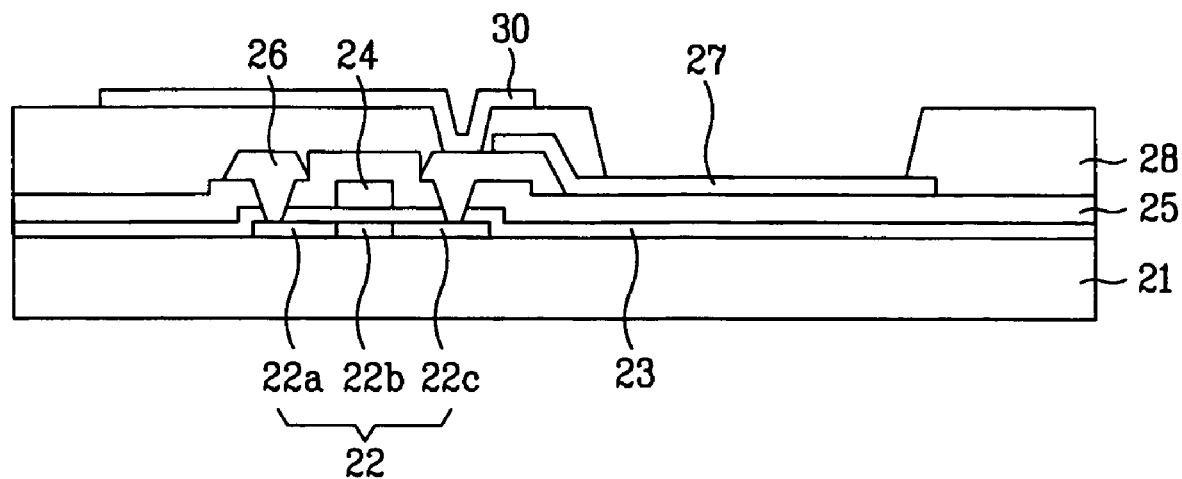
Figure 8F:
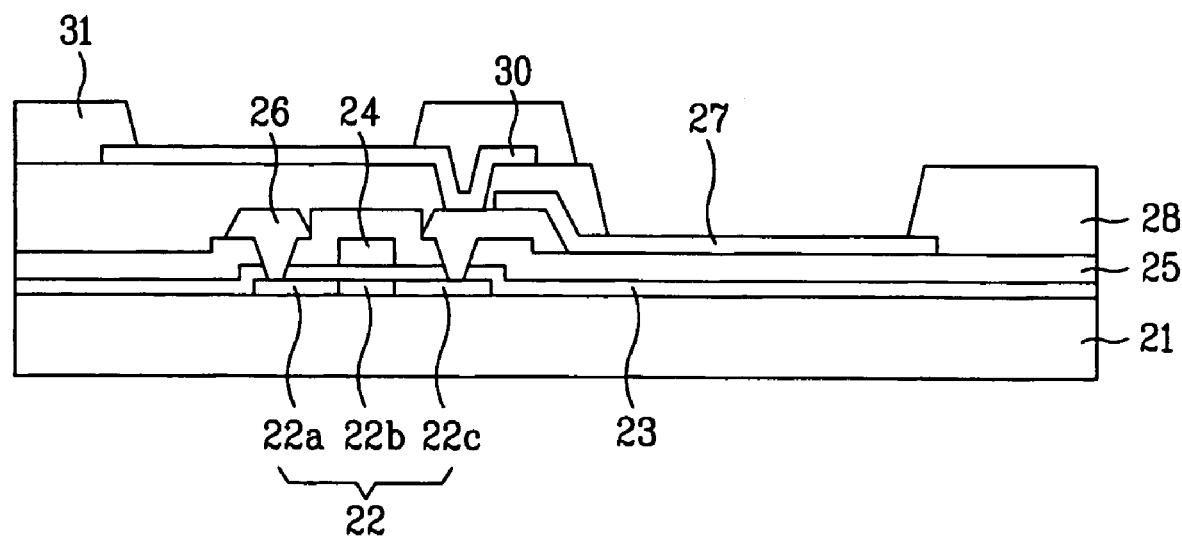
Figure 8G:
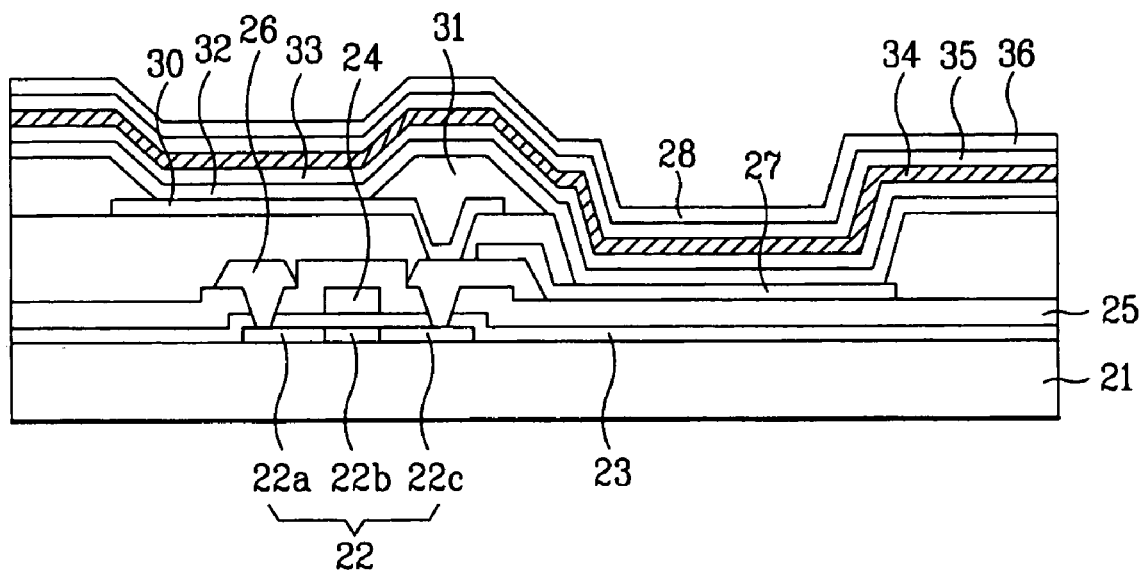
Figure 8H:
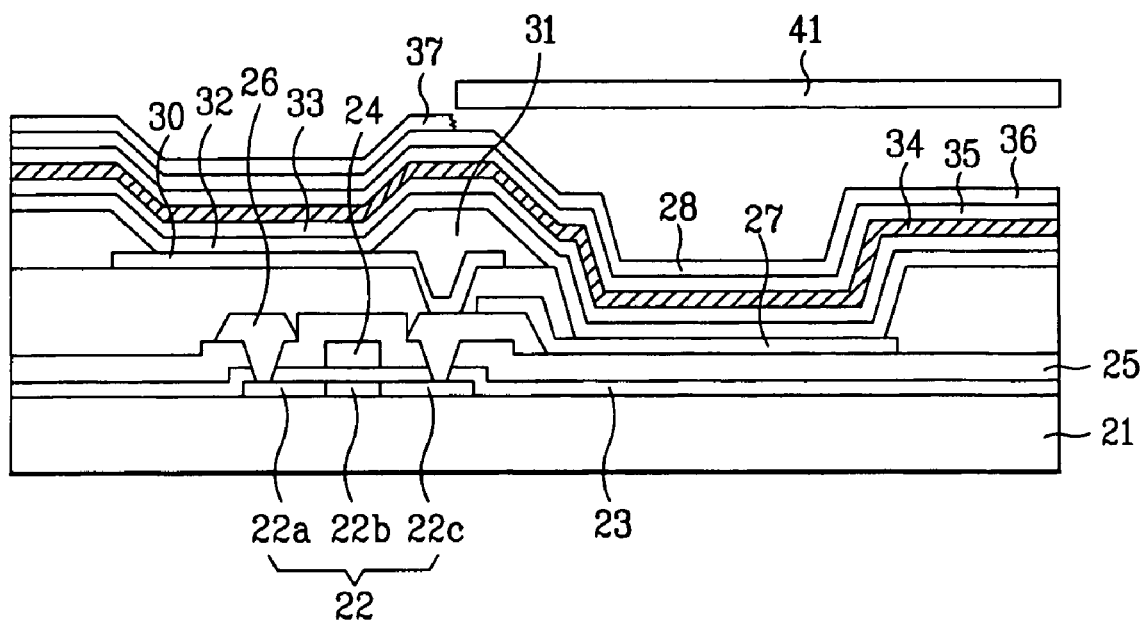

Referring to FIG. 8H, a first cathode 37 for top emission is formed on the electron injection layer 36 on the second area of the pixel area using a second shadow mask 41.

In this case, the first cathode 37 is a thin metal electrode having transmitivity and can be formed by depositing Al 1~10 nm thick and depositing Ag 1~15 nm thick on the Al, by depositing alloy of Mg:Ag or the like 1~15 nm thick or by using a conductive material having low conductivity.

Figure 8I:
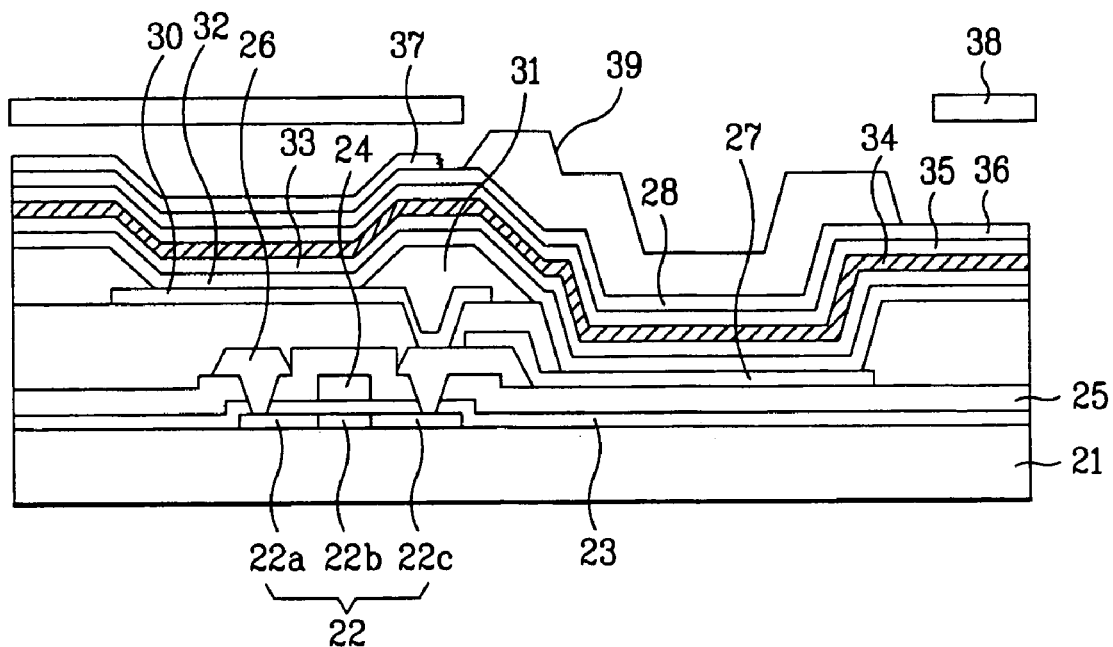

Referring to FIG. 8I, a second cathode 39 for bottom emission is formed on the electron injection layer 36 on the first area of the pixel area using a first shadow mask 38.

In this case, the second cathode 39 is formed of a conductive material having high reflectivity and low work function such as Al.

Figure 8J:
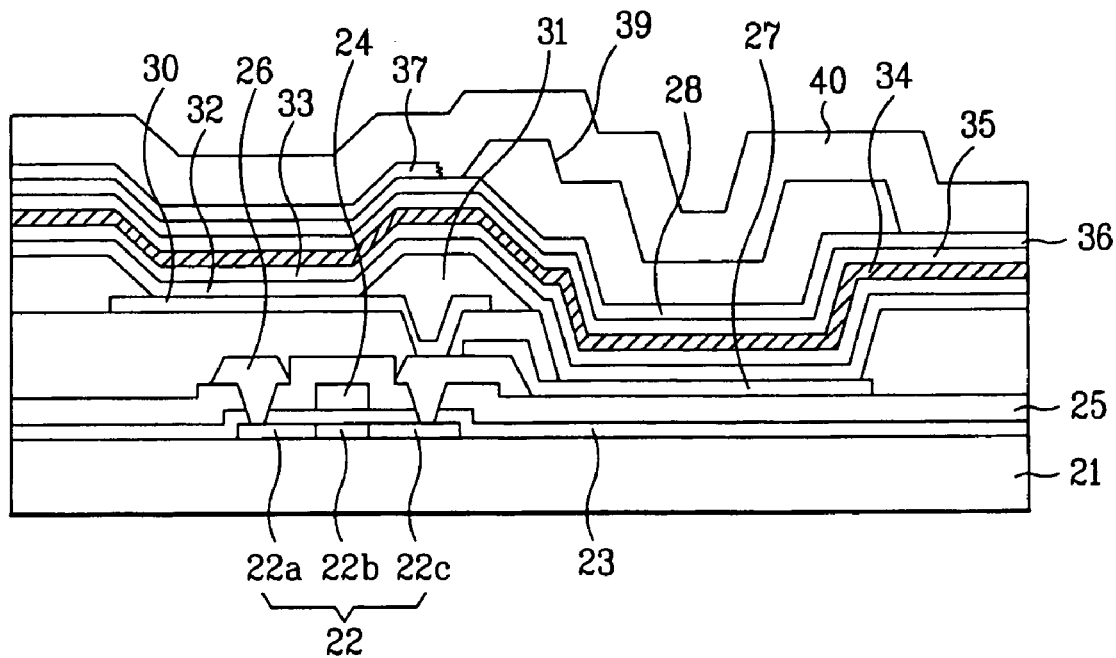

Referring to FIG. 8J, a passivation layer 40 is formed over the substrate to cut off penetration of oxygen or moisture into the organic EL layer. And, a protective cap (not shown in the drawing) is put thereon.

In a third or fourth embodiment of the present invention, a first EL device and a second EL device are respectively fabricated and are then bonded to each other to fabricate a top and bottom emission type organic EL display.

Figure 9A:
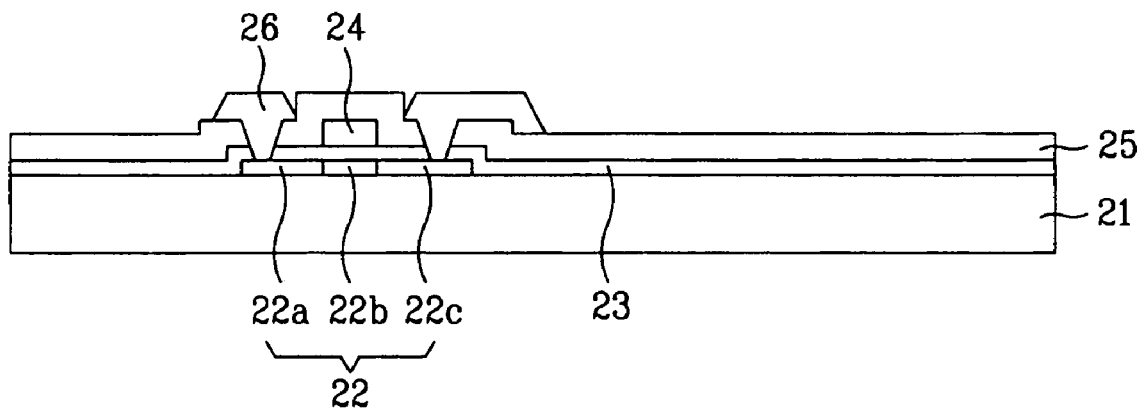
FIGS. 9A to 9F are cross-sectional diagrams for explaining a method of fabricating an organic EL display according to a third embodiment of the present invention.
Figure 9B:
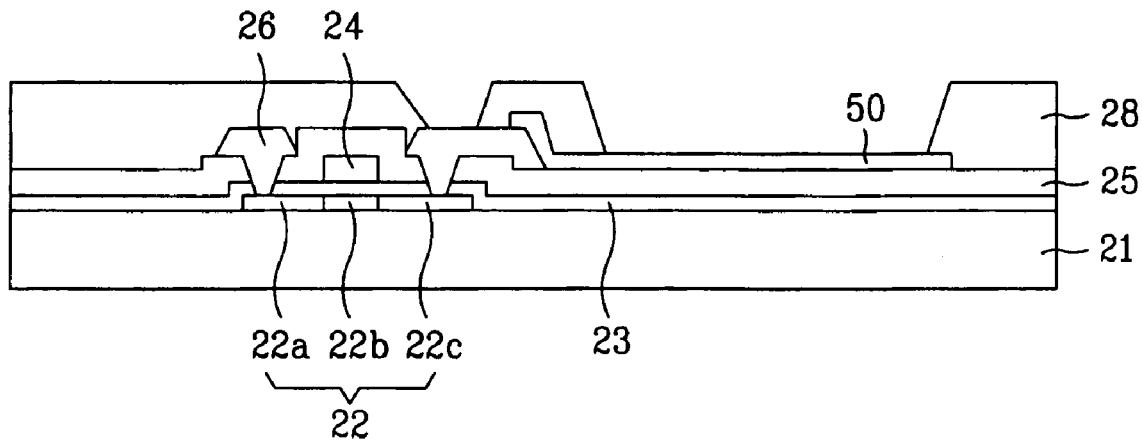
Figure 9C:
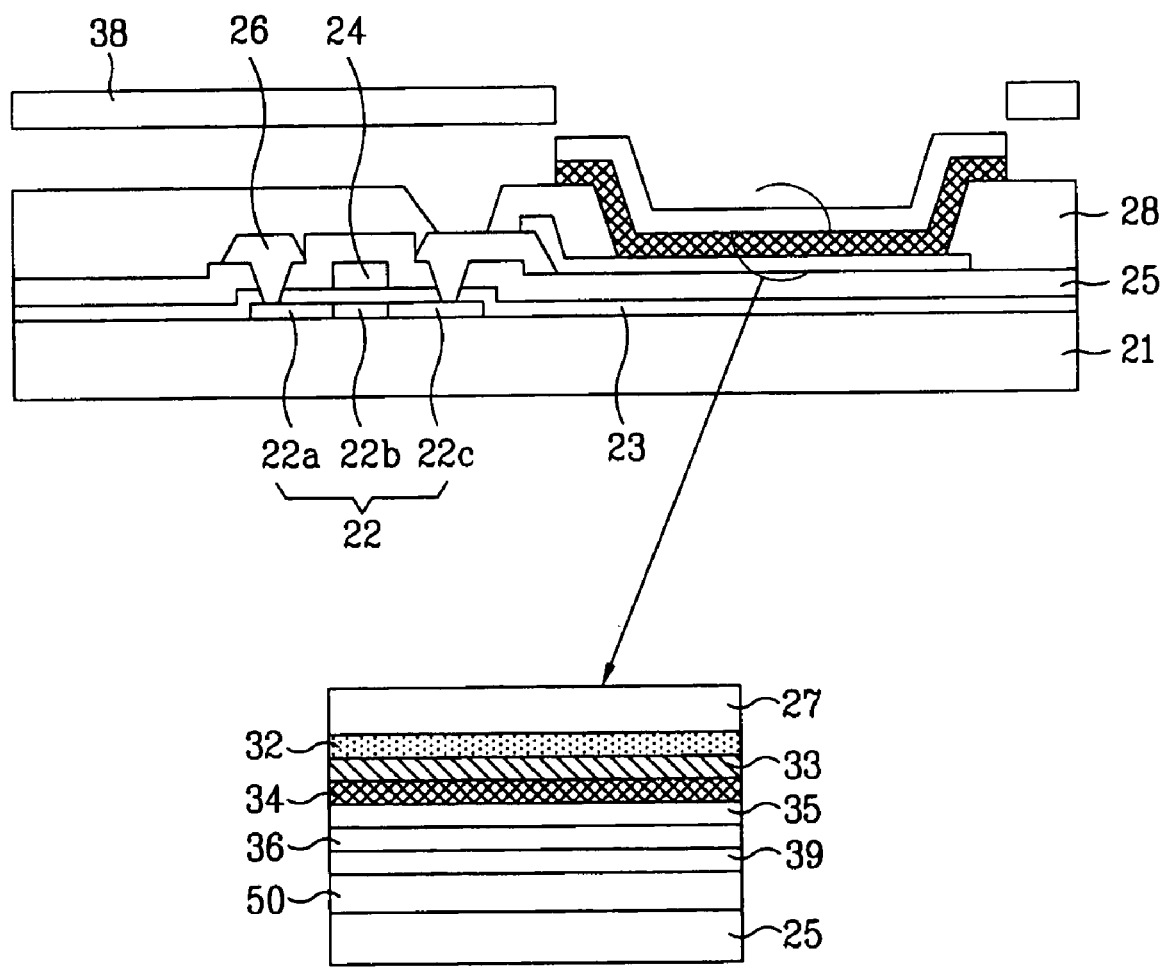
Figure 9D:
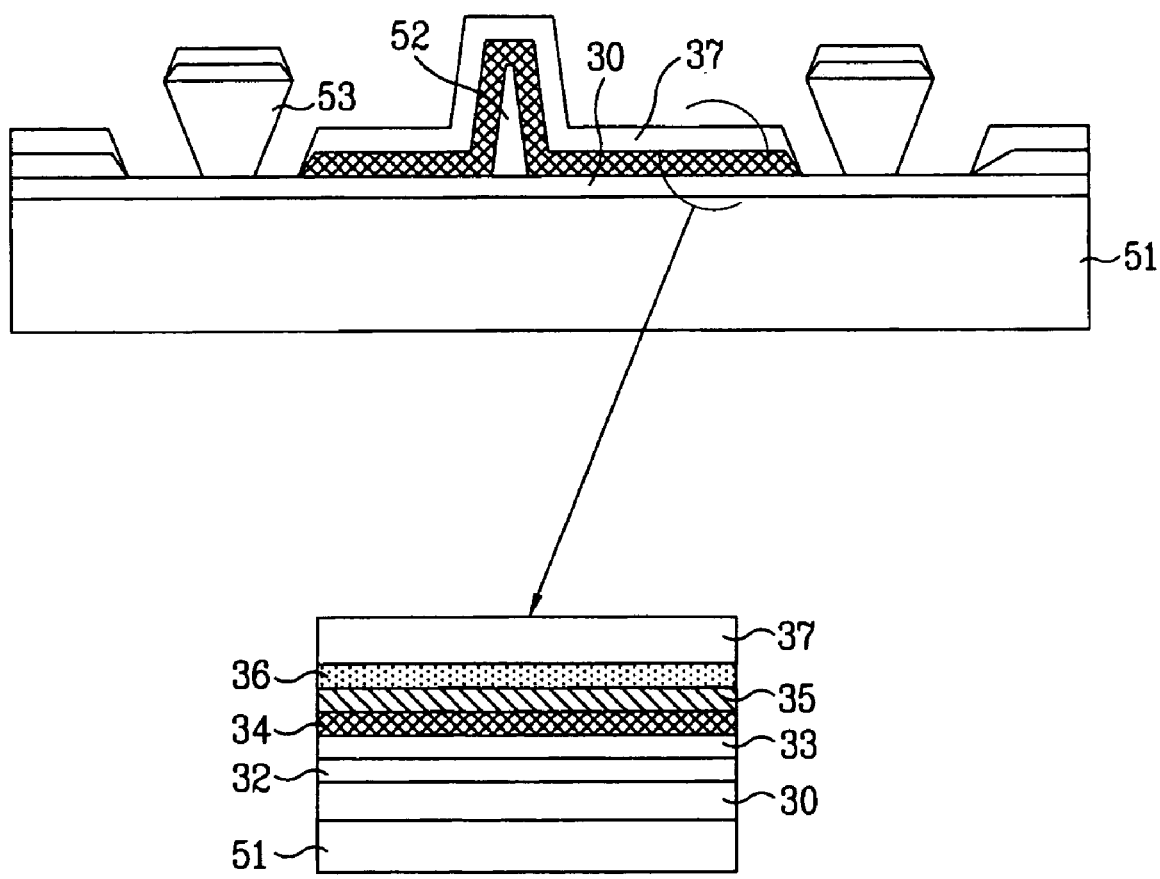
Figure 9E:
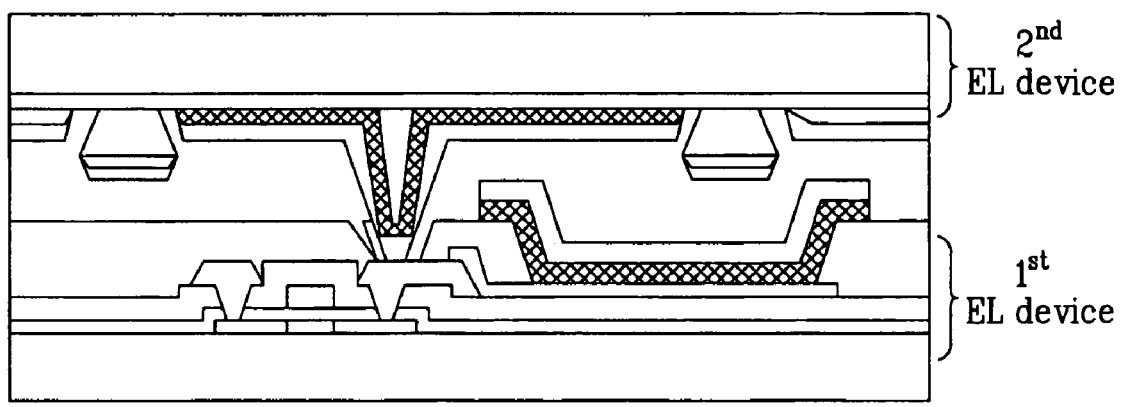
Figure 9F:
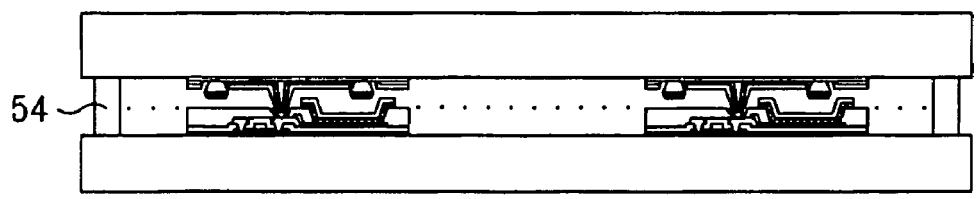
Figure 10:
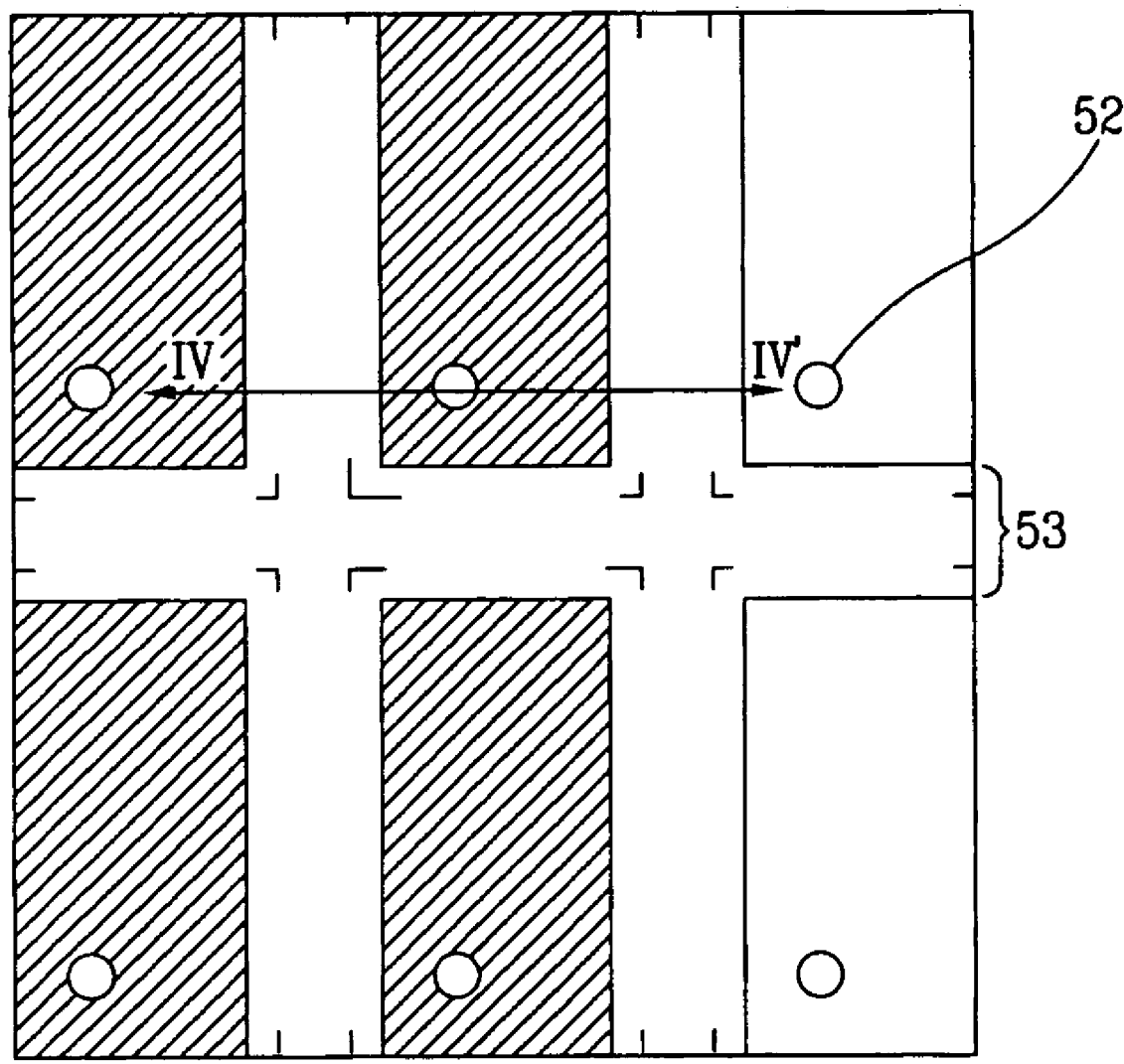
FIG. 10 is a layout of a second organic EL display according to a third embodiment of the present invention.

FIGS. 9A to 9F are cross-sectional diagrams for explaining a method of fabricating an organic EL display according to a third embodiment of the present invention and FIG. 10 is a layout of a second organic EL display according to a third embodiment of the present invention.

Referring to FIG. 9A, a thin film transistor is formed on a second area of a transparent substrate 21.

Referring to FIG. 9B, a transparent conductive material such as ITO, IZO and the like is formed on an insulating interlayer 25 and is then patterned to form an pixel electrode 50.

In this case, the pixel electrode 50 is formed on a first area of the transparent substrate 21 to be electrically connected to an electrode 26 of the thin film transistor.

Subsequently, an insulator is formed over the substrate to form a planarizing layer 28 for planarizing a surface of the substrate. The planarizing layer 28 is patterned to expose a portion of the electrode 26 of a drain region 22c and the pixel electrode 50.

Referring to FIG. 9C, a first cathode 39, an electron injection layer 36, an electron transport layer 35, an organic emitting layer 34, a hole transport layer 33, a hole injection layer 32 and a first anode 27 are sequentially formed on the exposed pixel electrode 50 to form a first organic EL device using a first shadow mask 38.

In this case, the first cathode 39 can be formed by depositing Al 1~10 nm thick and depositing Ag 1~15 nm thick on the Al, by depositing alloy of Mg:Ag or the like 1~15 nm thick or by using a conductive material having low conductivity.

And, a conductive substance having high reflectivity such a Cr, Al, Mo, Ag, Au and the like can be used as the first anode 27.

In this case, the first anode 27 electrically connects pixels emitting the same color.

Hence, the first shadow mask 38 used in fabricating the first organic EL device employs a strip type instead of a slot type.

Meanwhile, a second organic EL device is fabricated in the following manner.

FIG. 10 is a layout of a second organic EL device and FIG. 9D is a cross-sectional diagram taken along a cutting line IV-IV' in FIG. 10.

Referring to FIG. 9D and FIG. 10, a transparent conductive material having a high work function value is formed on a second transparent substrate 51 and is then patterned to form a second anode 30.

Subsequently, a separator 53 is formed over the substrate including the second anode 30 using an insulator such as polyimide. And, an island type barrier 52 is formed using another insulator.

An organic EL layer is formed by sequentially forming a hole injection layer 32, a hole transport layer 33, an organic emitting layer 34, an electron transport layer 35 and an electron injection layer 36 on the second anode 30 including the barrier 52.

A conductive layer having a low work function such as Al is deposited on the organic EL layer and is then patterned to form a second cathode 32 to complete a second organic EL device.

Referring to FIG. 9E and FIG. 9F, the first and second organic EL devices are bonded to each other so that the second cathode 37 of the second organic EL device is electrically connected to the electrode of the first organic EL device.

Hence, the present invention can drive the two organic EL devices separately or simultaneously using one drive transistor.

After a vacuum state is provided to an inner space between the two organic EL devices, the inner space is sealed using a sealant 54.

Figure 11A:
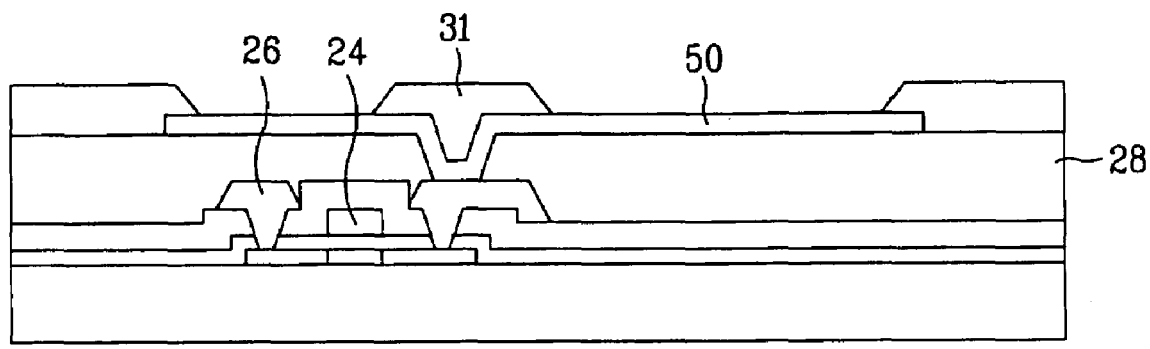
FIGS. 11A to 11C are cross-sectional diagrams for explaining a method of fabricating an organic EL display according to a fourth embodiment of the present invention.
Figure 11B:
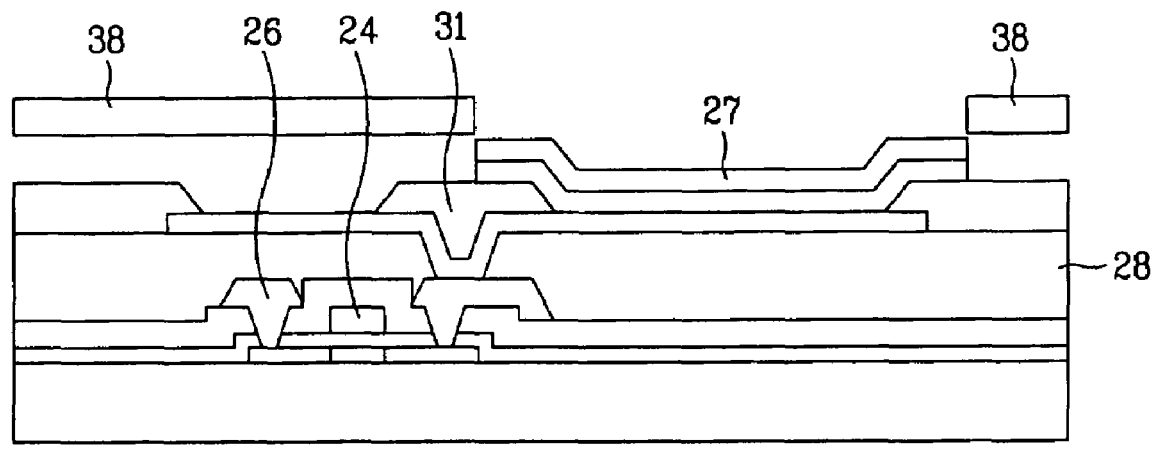
Figure 11C:
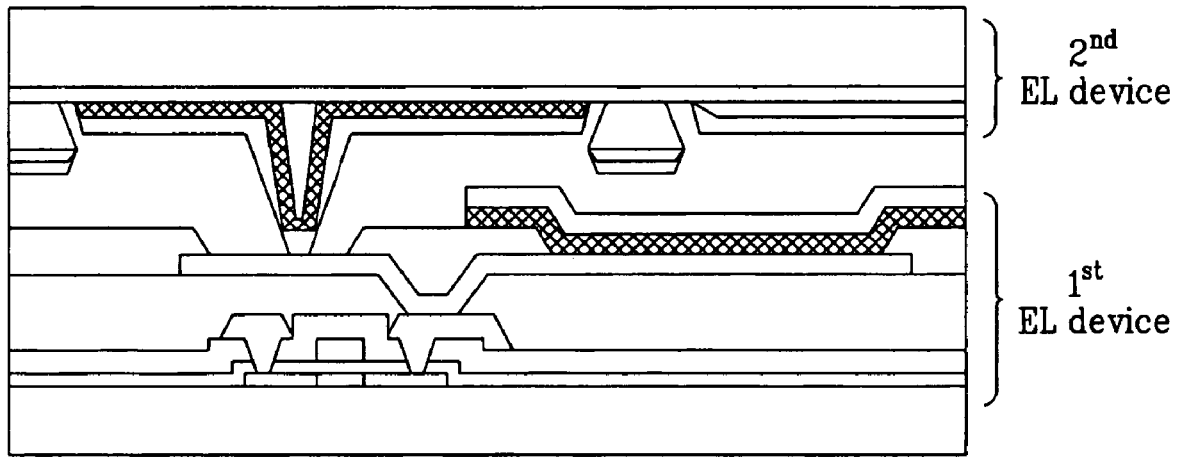

FIGS. 11A to 11C are cross-sectional diagrams for explaining a method of fabricating an organic EL display according to a fourth embodiment of the present invention.

A fourth embodiment of the present invention differs from the third embodiment of the present invention in a fabricating process of a first organic EL device.

Referring to FIG. 11A, a thin film transistor is formed on a second area of a transparent substrate 21.

A planarizing layer 28 is formed to planarize a surface by forming an insulator over the substrate and is then patterned to expose a portion of an electrode 26 of a drain region 22c.

A transparent conductive material such as ITO, IZO and the like is formed on the planarizing layer 28 to be electrically connected to the exposed electrode 26 and is then patterned to form an pixel electrode 50.

In doing so, the pixel electrode 50 is formed on first and second areas of the transparent substrate 21 to be electrically connected to the electrode 26 of the thin film transistor.

And, an insulating layer 31 is formed on an area electrically connecting the pixel electrode 50 and the electrode 26 of the thin film transistor together and an edge area of the pixel electrode 50.

Referring to FIG. 11B, a first cathode 39, an electron injection layer 36, an electron transport layer 35, an organic emitting layer 34, a hole transport layer 33, a hole injection layer 32 and a first anode 27 are sequentially formed on the exposed pixel electrode 50 using a first shadow mask 38 to fabricate a first organic EL device.

Referring to FIG. 11C, by bonding a second organic EL device fabricated by the method in FIG. 9E to the first organic EL device, a top and bottom emission type organic EL display is fabricated.

Accordingly, the present invention provides the following advantages or effects.

First of all, since both of the bottom emission and the top emission are simultaneously implemented using the same drive transistor, the present invention enables the fabrication of the display of new concept that enables users to view image from both sides and raises the economical value of the device.

Secondly, in case of applying the organic EL display according to the present invention to a mobile terminal, the present invention enables the implementation of an external display and an internal display using one display module to enable the development of a mobile phone or terminal of low price.

Thirdly, the present invention uses the related art process conditions to simplify the fabricating process, thereby enhancing mass productivity.

Fourthly, as the first cathode 38 for the top emission is separated from the second cathode 40 for bottom emission, the independent drives of the first and second organic EL devices are enabled.

Therefore, the present invention can drive the bottom emission and the top emission simultaneously or independently.

Finally, in case of applying the above-function to a mobile terminal, the present invention enables the implementations of displays for internal and external windows using one display module only.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic EL display comprising:
   a pixel area having a first area and a second area;
   a first organic EL device provided to the first area of the pixel area to emit light in one direction, the first organic EL device having a first anode and a first cathode;
   a second organic EL device provided to the second area of the pixel area to emit light in a direction opposite to that of the first organic EL device, the second organic EL device having a second anode and a second cathode; and
   a transistor electrically connected to the first and second organic EL devices to drive the first and second organic EL devices,
   wherein the first anode and the second anode separately are formed at the first area and the second area, respectively.

2. The organic EL display of claim 1, wherein the first area is a first substrate surface having the transistor not formed thereon and wherein the second area is the first substrate surface having the transistor formed thereon.

3. The organic EL display of claim 1, wherein the first area is a first substrate surface on which the transistor and the first organic EL device are formed and wherein the second area is a second substrate surface on which the second organic EL device is formed.

4. An organic EL display comprising:
   a transparent substrate having a plurality of pixel areas wherein each of a plurality of the pixel areas is divided into a first area and a second area;
   a transistor formed on the second area of the transparent substrate;
   a second anode formed on the second area of the transparent substrate to be electrically connected to the transistor;
   a first anode formed on the first area of the transparent substrate to be electrically connected to the transistor, wherein the first anode and the second anode separately are formed at the first area and the second area, respectively;
   an organic EL layer formed on the first and second anodes;
   a first cathode formed on the organic EL layer on the first and second areas of the transparent substrate; and
   a second cathode formed on the first cathode of the first area of the transparent substrate.

5. The organic EL display of claim 4, wherein the second anode is a transparent electrode and wherein the first cathode is a metal electrode having high reflectivity.

6. The organic EL display of claim 4, wherein the second anode comprises a metal electrode having high reflectivity and wherein the first cathode comprises a thin metal electrode having transmittance.

7. The organic EL display of claim 4, wherein an insulating layer is formed on a connecting area between the transistor and the first and second anodes and on edge areas of the first and second anodes.

8. An organic EL display comprising:
a transparent substrate having a plurality of pixel areas wherein each of a plurality of the pixel areas is divided into a first area and a second area;
a transistor formed on the second area of the transparent substrate;
a second anode formed on the second area of the transparent substrate to be electrically connected to the transistor, wherein the first anode and the second anode separately are formed at the first area and the second area, respectively;
a first anode formed on the first area of the transparent substrate to be electrically connected to the transistor;
an organic EL layer formed on the first and second anodes;
a first cathode formed on the organic EL layer on the second area of the transparent substrate; and
a second cathode formed on the organic EL layer on the first area of the transparent substrate.

9. The organic EL display of claim 8, wherein the first anode is a transparent electrode and wherein the second cathode is a metal electrode having high reflectivity.

10. The organic EL display of claim 8, wherein the second anode comprises a metal electrode having high reflectivity and wherein the first cathode comprises a thin metal electrode having transmittance.

11. An organic EL display comprising:
a first transparent substrate;
a second transparent substrate;
a transistor formed on a first area of the first transparent substrate;
an pixel electrode formed on a second area of the first transparent substrate to be electrically connected to the transistor;
a first cathode formed on the pixel electrode;
a first organic EL layer formed on the first cathode;
a first anode formed on the first organic EL layer;
a second anode formed on the first organic EL layer, wherein the first anode and the second anode separately are formed at the first area and the second area, respectively;
a second organic EL layer formed on the second anode; and
a second cathode formed on the second organic EL layer to be electrically connected to either the transistor or the pixel electrode.

12. The organic EL display of claim 11, wherein the pixel electrode and the second anodes are transparent electrodes, wherein the first cathode comprises a thin metal electrode having transmittance, and wherein the first anode and the second cathode are metal electrodes having high reflectivity each.

13. The organic EL display of claim 11, wherein a barrier is provided to a predetermined area of the second anode.

14. The organic EL display of claim 13, wherein the second cathode formed on the barrier is electrically connected to either the transistor or the pixel electrode.

* * * * *